United States Patent
Hsu

(10) Patent No.: US 11,594,447 B2
(45) Date of Patent: Feb. 28, 2023

(54) SEMICONDUCTOR DEVICE STRUCTURE WITH MULTIPLE LINERS AND METHOD FOR FORMING THE SAME

(71) Applicant: NANYA TECHNOLOGY CORPORATION, New Taipei (TW)

(72) Inventor: Chia-Hsiang Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/245,795

(22) Filed: Apr. 30, 2021

(65) Prior Publication Data
US 2022/0352008 A1    Nov. 3, 2022

(51) Int. Cl.
*H01L 21/762*    (2006.01)
*H01L 27/06*    (2006.01)
H01L 27/1159    (2017.01)

(52) U.S. Cl.
CPC .. *H01L 21/76283* (2013.01); *H01L 21/76224* (2013.01); *H01L 27/0629* (2013.01); *H01L 27/1159* (2013.01)

(58) Field of Classification Search
CPC ......... H01L 21/76283; H01L 21/76224; H01L 27/0629; H01L 21/763; H01L 21/76229; H01L 21/84
USPC .......................... 257/506, 507; 438/207, 218
See application file for complete search history.

(56) References Cited

U.S. PATENT DOCUMENTS

| | | | |
|---|---|---|---|
| 2015/0255538 A1 | 9/2015 | Doris et al. | |
| 2015/0348977 A1 | 12/2015 | Barth, Jr. et al. | |
| 2017/0098616 A1 | 4/2017 | Kaltalioglu et al. | |
| 2018/0158828 A1* | 6/2018 | Han et al. | ......... H01L 27/10823 |

FOREIGN PATENT DOCUMENTS

| | | |
|---|---|---|
| CN | 111933529 A | 11/2020 |
| TW | 202018859 A | 5/2020 |

OTHER PUBLICATIONS

Office Action and Search Report dated Jul. 6, 2022 of TW Application No. 110135899 and English translation, 11 pages.

* cited by examiner

*Primary Examiner* — Thinh T Nguyen
(74) *Attorney, Agent, or Firm* — Muncy, Geissler, Olds & Lowe, P.C.

(57) ABSTRACT

A semiconductor device structure includes a silicon-on-insulator (SOI) region. The SOI region includes a semiconductor substrate, a buried oxide layer disposed over the semiconductor substrate, and a silicon layer disposed over the buried oxide layer. The semiconductor device structure also includes a first shallow trench isolation (STI) structure penetrating through the silicon layer and the buried oxide layer and extending into the semiconductor substrate. The first STI structure includes a first liner contacting the semiconductor substrate and the silicon layer, a second liner covering the first liner and contacting the buried oxide layer, and a third liner covering the second liner. The first liner, the second liner and the third liner are made of different materials. The first STI structure also includes a first trench filling layer disposed over the third liner and separated from the second liner by the third liner.

7 Claims, 20 Drawing Sheets

SEMICONDUCTOR DEVICE STRUCTURE WITH MULTIPLE LINERS AND METHOD FOR FORMING THE SAME

TECHNICAL FIELD

The present disclosure relates to a semiconductor device structure and a method for forming the same, and more particularly, to a semiconductor device structure with multiple liners and a method for forming the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a silicon-on-insulator (SOI) region. The SOI region includes a semiconductor substrate, a buried oxide layer disposed over the semiconductor substrate, and a silicon layer disposed over the buried oxide layer. The semiconductor device structure also includes a first shallow trench isolation (STI) structure penetrating through the silicon layer and the buried oxide layer and extending into the semiconductor substrate. The first STI structure includes a first liner contacting the semiconductor substrate and the silicon layer, a second liner covering the first liner and contacting the buried oxide layer, and a third liner covering the second liner. The first liner, the second liner and the third liner are made of different materials. The first STI structure also includes a first trench filling layer disposed over the third liner and separated from the second liner by the third liner.

In an embodiment, the first liner completely separates the second liner from the semiconductor substrate and the silicon layer. In an embodiment, the first liner includes a first portion and a second portion covering opposite sidewalls of the silicon layer, and a third portion disposed between the second liner and the semiconductor substrate, wherein the first portion, the second portion and the third portion of the first liner are disconnected with each other. In an embodiment, the first liner is made of silicon oxide, the second liner is made of nitride, and the third liner is made of silicon oxynitride. In addition, a first etching selectivity exists between the second liner and the first trench filling layer, and a second etching selectivity exists between the third liner and the first trench filling layer.

In an embodiment, the semiconductor device structure further includes a pad oxide layer disposed over the silicon layer of the SOI region, and a pad nitride layer disposed over the pad oxide layer, wherein the first STI structure penetrates through the pad oxide layer and the pad nitride layer, and wherein sidewalls of the pad oxide layer and sidewalls of the pad nitride layer are covered by and in direct contact with the second liner of the first STI structure. In an embodiment, the semiconductor device structure further includes a second shallow trench isolation (STI) structure penetrating through the pad oxide layer and the pad nitride layer and extending into the semiconductor substrate. The second STI structure includes a second trench filling layer, and a fourth liner separating the second trench filling layer from the pad oxide layer, the pad nitride layer and the semiconductor substrate. In an embodiment, the first STI structure is disposed in an array area, and the second STI structure is disposed in a peripheral circuit area.

In another embodiment of the present disclosure, a method for forming a semiconductor device structure is provided. The method includes forming a pad oxide layer over a semiconductor substrate, and forming a pad nitride layer over the pad oxide layer. The method also includes forming a shallow trench penetrating through the pad nitride layer and the pad oxide layer and extending into the semiconductor substrate, and forming a first liner over sidewalls and a bottom surface of the shallow trench. The method further includes forming a second liner over the first liner, and forming a third liner over the second liner. In addition, the method includes filling a remaining portion of the shallow trench with a trench filling layer over the third liner, and planarizing the second liner, the third liner and the trench filling layer to expose the pad nitride layer. The first liner and the remaining portions of the second liner, the third liner and the trench filling layer collectively form a shallow trench isolation (STI) structure in an array area.

In an embodiment, the second liner is formed in direct contact with sidewalls of the pad oxide layer and sidewalls of the pad nitride layer. In an embodiment, a first etching selectivity exists between the second liner and the trench filling layer, and a second etching selectivity exists between the third liner and the trench filling layer. In an embodiment, before forming the pad oxide layer, the method further includes forming a buried oxide layer over the semiconductor substrate, and forming a silicon layer over the buried oxide layer, wherein the shallow trench penetrates through the buried oxide layer and the silicon layer, and wherein the first liner is formed by performing an oxidation process on the silicon layer and the semiconductor substrate.

In an embodiment, the second liner is formed by a rapid thermal nitridation (RTN) process, and the third liner is formed by an in-situ steam generation (ISSG) process. In an embodiment, before forming the pad oxide layer, the method further includes forming a well region in the semiconductor substrate, wherein the well region is p-type, and a region of the semiconductor substrate under the well region is n-type, and wherein after the shallow trench is formed, a bottom surface of the shallow trench is higher than a bottom surface of the well region.

Embodiments of a semiconductor device structure and method for forming the same are provided in the disclosure. In some embodiments, the semiconductor device structure includes a shallow trench isolation (STI) structure disposed in a semiconductor substrate (or in a silicon-on-insulator (SOI) region). The STI structure includes a first liner contacting the semiconductor substrate, a second liner covering the first liner, a third liner covering the second liner, and a trench filling layer disposed over the third liner. Since there are multiple liners disposed between the trench filling layer and the semiconductor substrate, the sidewalls of the semiconductor substrate interfacing with the STI structure may be protected from being exposed during subsequent etching process. This may prevent electrical short of the semiconductor device structure in subsequent processing steps. As a result, the device performance may be enhanced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
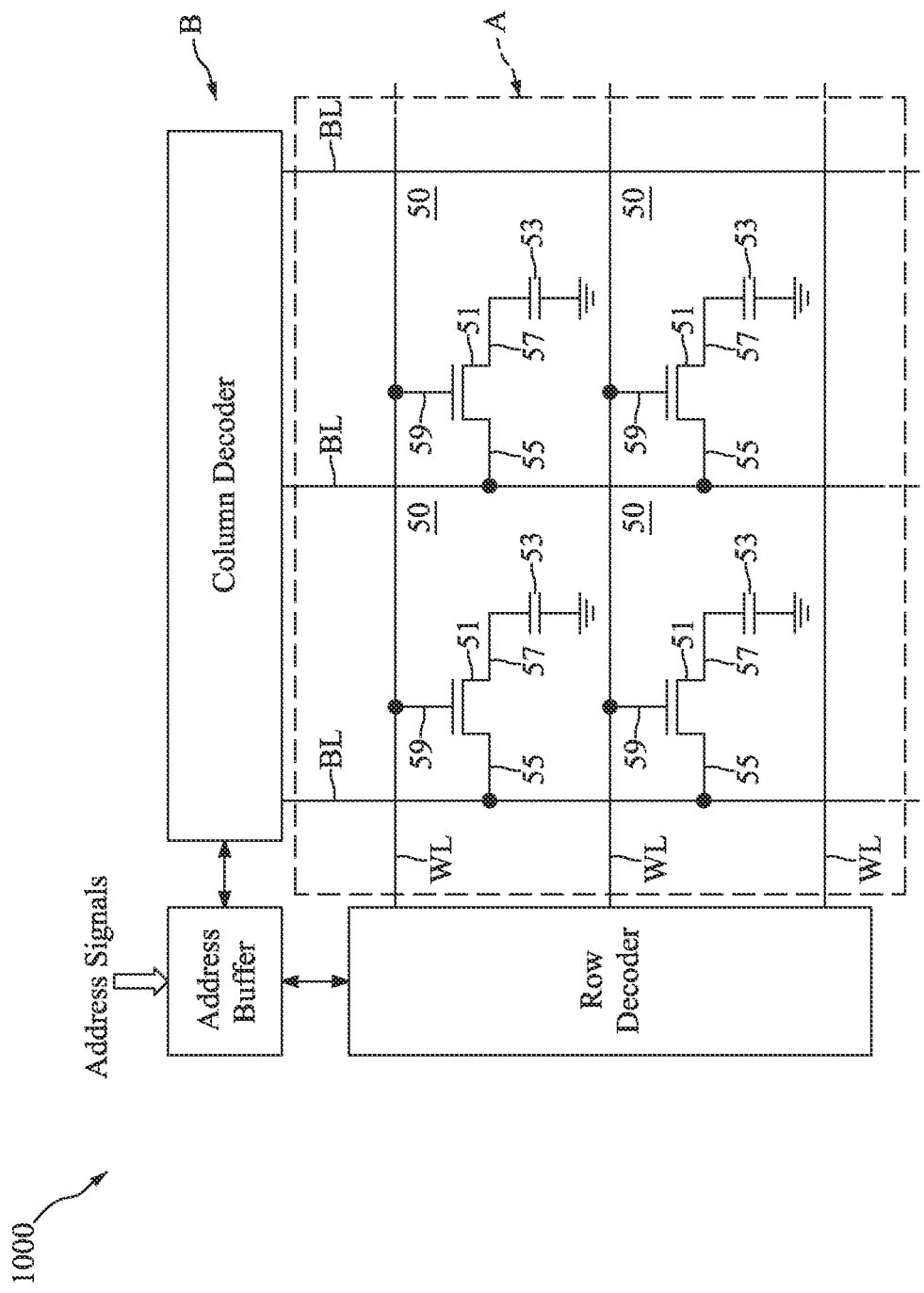
FIG. 1 is a partial schematic illustration of an exemplary integrated circuit, including an array area and a peripheral circuit area in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a partial schematic illustration of an exemplary integrated circuit, such as a memory device 1000, including an array area A and a peripheral circuit area B in accordance with some embodiments. In some embodiments, the memory device 1000 includes a dynamic random access memory (DRAM). In some embodiments, the array area A of the memory device 1000 includes a number of memory cells 50 arranged in a grid pattern and including a number of rows and columns. The number of memory cells 50 in the array area A may vary depending on system requirements and fabrication technology.

In some embodiments, each of the memory cells 50 in the array area A includes an access device and a storage device. The access device is configured to provide controlled access to the storage device. In particular, the access device is a field effect transistor (FET) 51 and the storage device is a capacitor 53, in accordance with some embodiments. In each of the memory cells 50, the FET 51 includes a drain 55, a source 57 and a gate 59. One terminal of the capacitor 53 is electrically connected to the source 57 of the FET 51, and the other terminal of the capacitor 53 may be electrically connected to the ground. In addition, in each of the memory cells 50, the gate 59 of the FET 51 is electrically connected to a word line WL, and the drain 55 of the FET 51 is electrically connected to a bit line BL.

The above description mentions the terminal of the FET 51 electrically connected to the capacitor 53 is the source 57, and the terminal of the FET 51 electrically connected to the bit line BL is the drain 55. However, during read and write operations, the terminal of the FET 51 electrically connected to the capacitor 53 may be the drain, and the terminal of the FET 51 electrically connected to the bit line BL may be the source. That is, either terminal of the FET 51 could be a source or a drain depending on the manner in which the FET 51 is being controlled by the voltages applied to the source, the drain and the gate.

By controlling the voltage at the gate 59 via the word line WL, a voltage potential may be created across the FET 51 such that the electrical charge can flow from the drain 55 to the capacitor 53. Therefore, the electrical charge stored in the capacitor 53 may be interpreted as a binary data value in the memory cell 50. For example, a positive charge above a threshold voltage stored in the capacitor 53 may be interpreted as binary "1." If the charge in the capacitor 53 is below the threshold value, a binary value of "0" is said to be stored in the memory cell 50.

The bit lines BL are configured to read and write data to and from the memory cells 50 in the array area A. The word lines WL are configured to activate the FET 51 to access a particular row of the memory cells 50 in the array area A. Accordingly, the memory device 1000 also includes the periphery circuit area B which may include an address buffer, a row decoder and a column decoder. The row decoder and the column decoder selectively access the memory cells 50 in response to address signals that are provided to the address buffer during read, write and refresh operations. The address signals are typically provided by an external controller such as a microprocessor or another type of memory controller.

Figure 2:
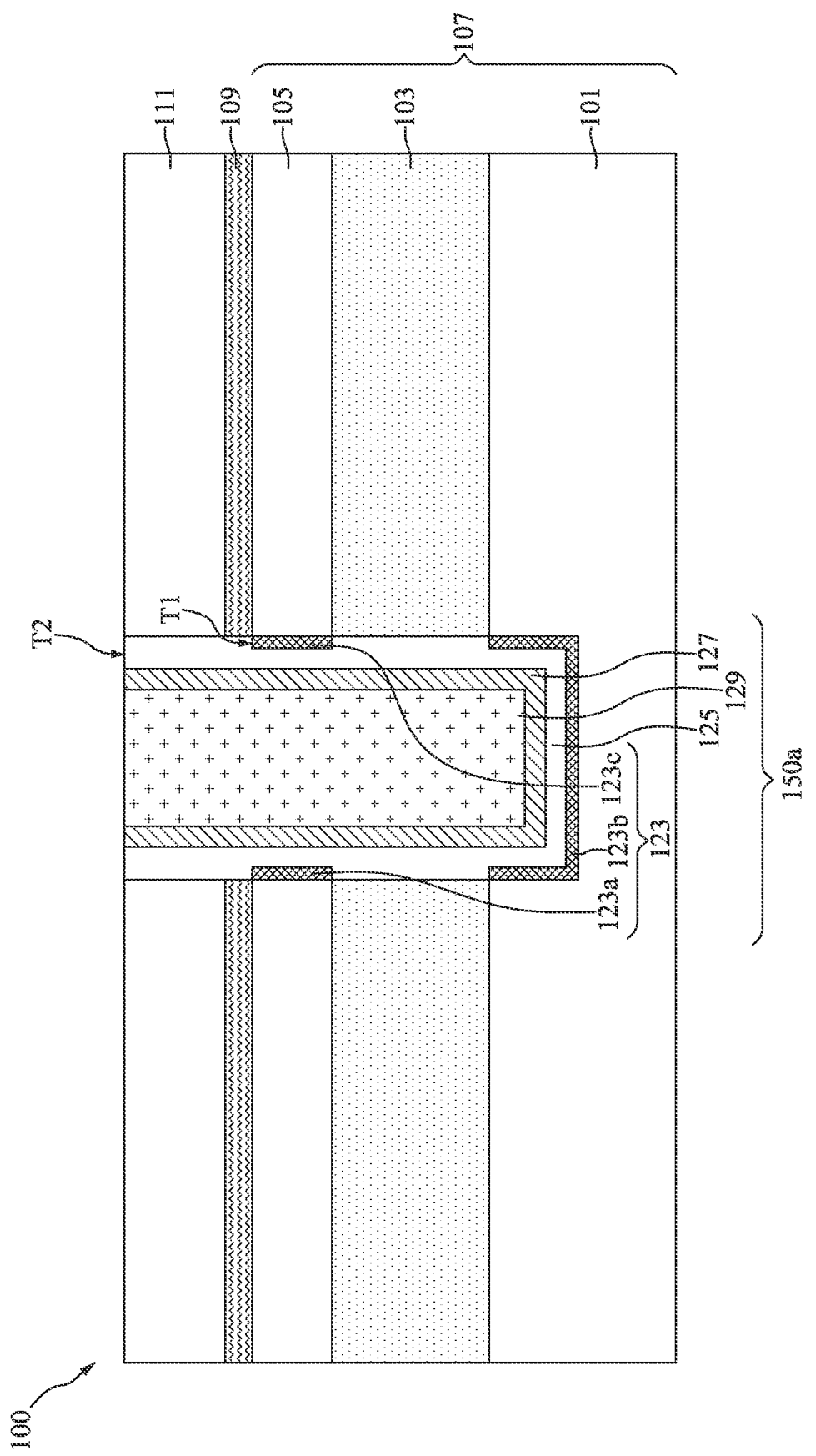
FIG. 2 is a cross-sectional view illustrating a cell area of a semiconductor device structure, in accordance with some embodiments.
Figure 3:
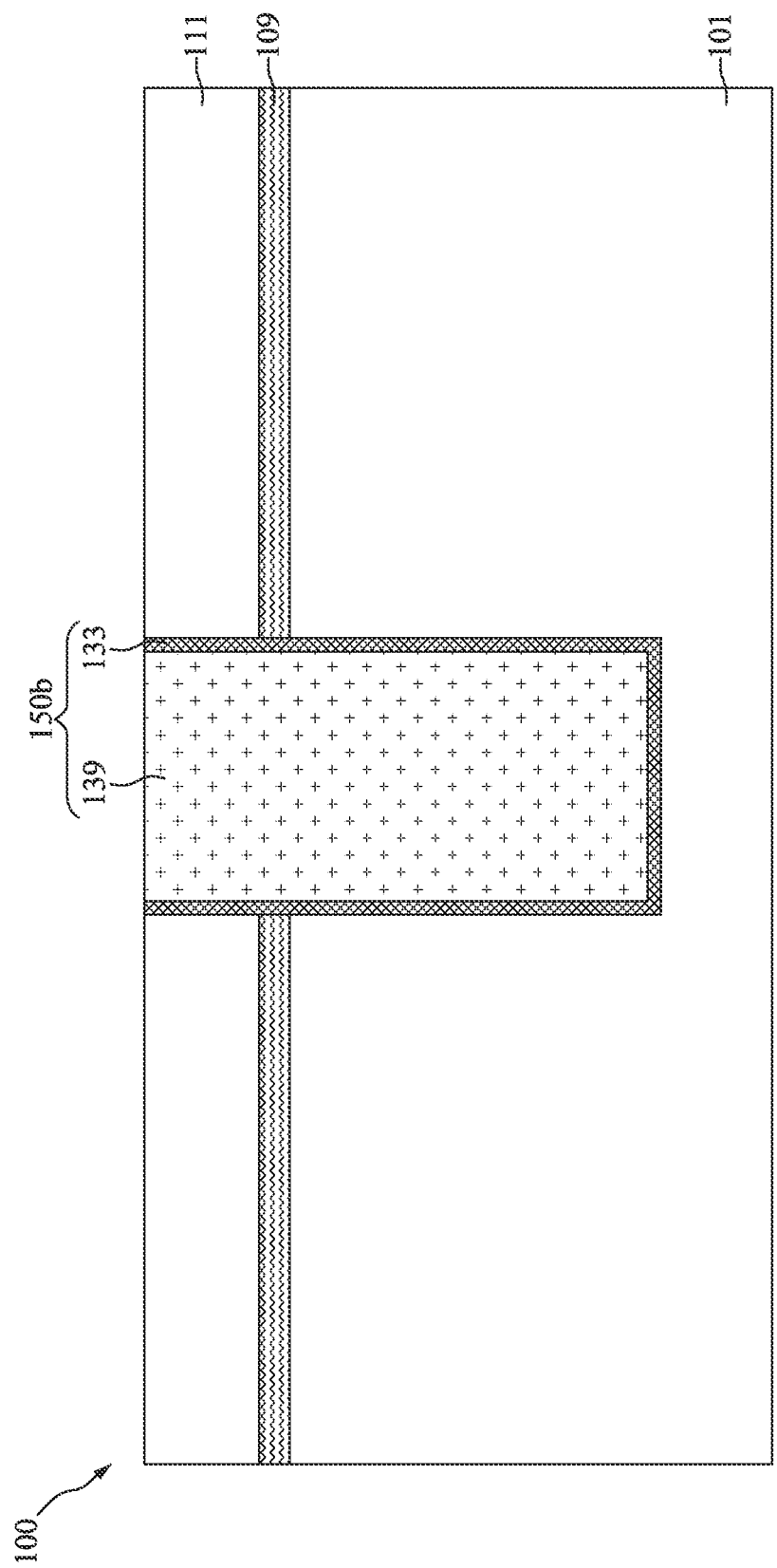
FIG. 3 is a cross-sectional view illustrating a peripheral circuit area of a semiconductor device structure, in accordance with some embodiments.

FIG. 2 is a cross-sectional view illustrating a cell area of a semiconductor device structure 100, such as the cell area A of the memory device 1000 in FIG. 1, and FIG. 3 is a cross-sectional view illustrating a peripheral circuit area of the semiconductor device structure 100, such as the peripheral circuit area B of the memory device 1000 in FIG. 1, in accordance with some embodiments.

As shown in FIG. 2, the cell area of the semiconductor device structure 100 includes a silicon-on-insulator (SOI) region 107, which includes a semiconductor substrate 101, a buried oxide layer 103 disposed over the semiconductor substrate 101, and a silicon layer 105 disposed over the buried oxide layer 103, in accordance with some embodiments. Moreover, a pad oxide layer 109 is disposed over the SOI region 107, and a pad nitride layer 111 is disposed over the pad oxide layer 109.

The cell area of the semiconductor device structure 100 also includes a shallow trench isolation (STI) structure 150*a* penetrating through the pad nitride layer 111 and the pad oxide layer 109 and extending into the SOI region 107, in accordance with some embodiments. Specifically, the STI structure 150*a* penetrates through the silicon layer 105 and the buried oxide layer 103 and extends into the semiconductor substrate 101. In some embodiments, the semiconductor substrate 101 is not penetrated through by the STI structure 150*a*.

In some embodiments, the STI structure 150*a* in the cell area of the semiconductor device structure 100 includes a first liner 123, a second liner 125 disposed over the first liner 123, a third liner 127 disposed over the second liner 125, and a trench filling layer 129 disposed over the third liner 127. In some embodiments, the trench filling layer 129 is surrounded by the third liner 127, the third liner 127 is surrounded by the second liner 125, and the second liner 125 is separated from the silicon layer 105 and the semiconductor substrate 101 by the first liner 123. In particular, the first liner 123 has portions 123*a* and 123*c* covering opposite sidewalls of the silicon layer 105, and a portion 123*b* separating the second liner 125 from the semiconductor substrate 101, in accordance with some embodiments.

It should be noted that the portions 123*a*, 123*b* and 123*c* of the first liner 123 are disconnected with each other. In some embodiments, the sidewalls of the pad nitride layer 111 and the sidewalls of the pad oxide layer 109 are covered by and in direct contact with the second liner 125. In some embodiments, the topmost surface T2 of the second liner 125 is higher than the topmost surface T1 of the first liner 123 (i.e., the top surface of the portion 123*a* or the top surface of the portion 123*c*). In some embodiments, the top surfaces of the second liner 125, the third liner 127 and the trench filling layer 129 are substantially coplanar with each other. Within the context of this disclosure, the word "substantially" means preferably at least 90%, more preferably 95%, even more preferably 98%, and most preferably 99%.

In addition, the first liner 123, the second liner 125 and the third liner 127 of the STI structure 150*a* in the array area of the semiconductor device structure 100 are made of different materials. For example, the first liner 123 is made of silicon oxide, the second liner 125 is made of nitride, and the third liner 127 is made of silicon oxynitride. Furthermore, a first etching selectivity exists between the second liner 125 and the trench filling layer 129, and a second etching selectivity exists between the third liner 127 and the trench filling layer 129.

As shown in FIG. 3, the peripheral circuit area of the semiconductor device structure 100 includes the semiconductor substrate 101, the pad oxide layer 109, the pad nitride layer 111, and a STI structure 150b penetrating through the pad nitride layer 111 and the pad oxide layer 109 and extending into the semiconductor substrate 101, in accordance with some embodiments. In some embodiments, the semiconductor substrate 101 is not penetrated through by the STI structure 150b in the peripheral circuit area.

In comparison with the STI structure 150a in the cell area of the semiconductor device structure 100, the STI structure 150b in the peripheral circuit area of the semiconductor device structure 100 has a single liner instead of multiple liners. In some embodiments, the STI structure 150b has a liner 133 (also referred to as a fourth liner) and a trench filling layer 139 disposed over the liner 133. In some embodiments, the trench filling layer 139 is surrounded by the liner 133.

Moreover, in some embodiments, the trench filling layer 139 is separated from the pad nitride layer 111, the pad oxide layer 109 and the semiconductor substrate 101 by the liner 133. In some embodiments, the top surfaces of the liner 133 and the trench filling layer 139 are substantially coplanar with each other. In some embodiments, the liner 133 is made of silicon oxide, and is formed by an oxidation process or a deposition process, such as a chemical vapor deposition (CVD) process or an atomic layer deposition (ALD) process.

Figure 4:
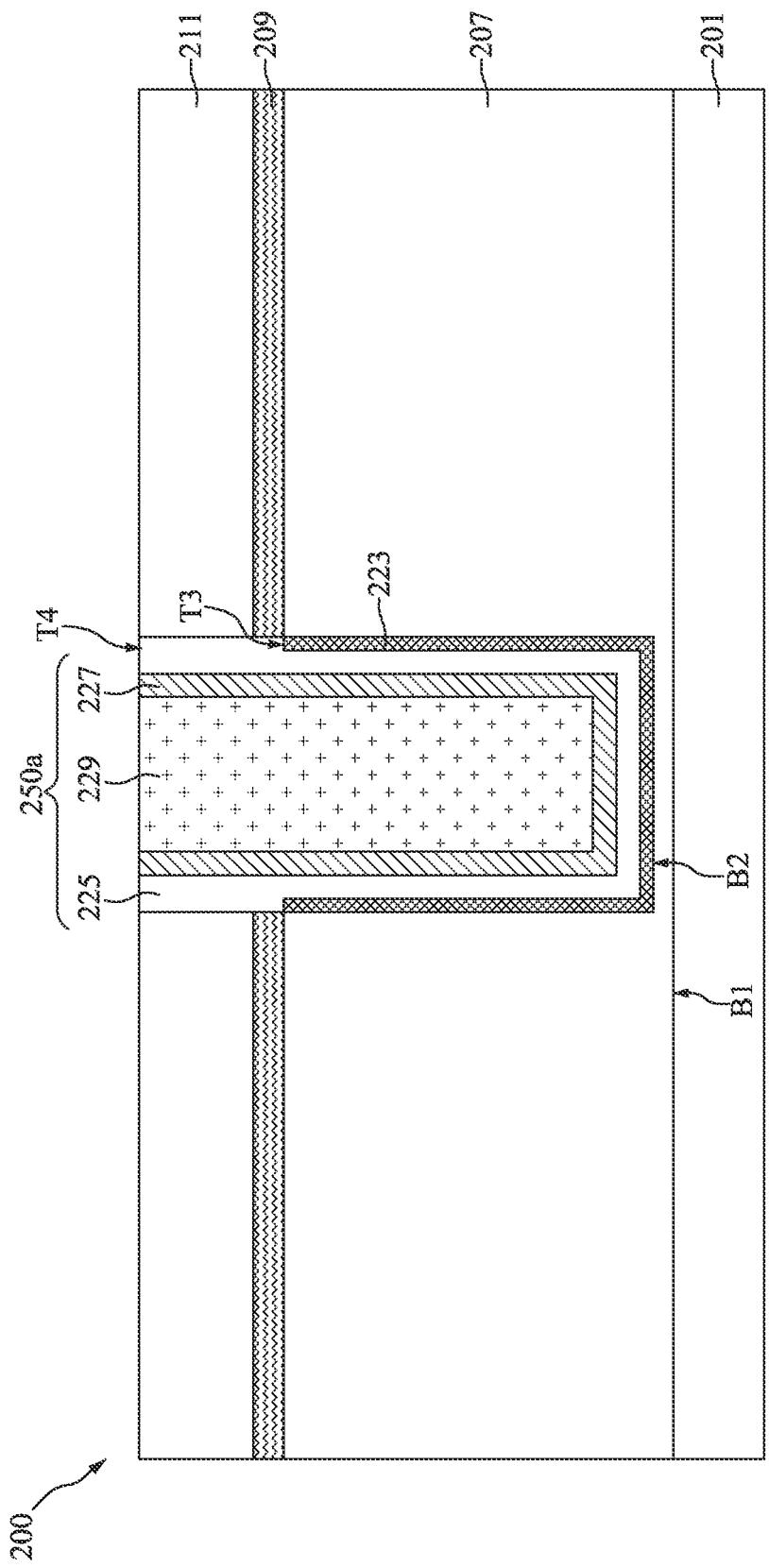
FIG. 4 is a cross-sectional view illustrating a cell area of a semiconductor device structure, in accordance with some embodiments.
Figure 5:
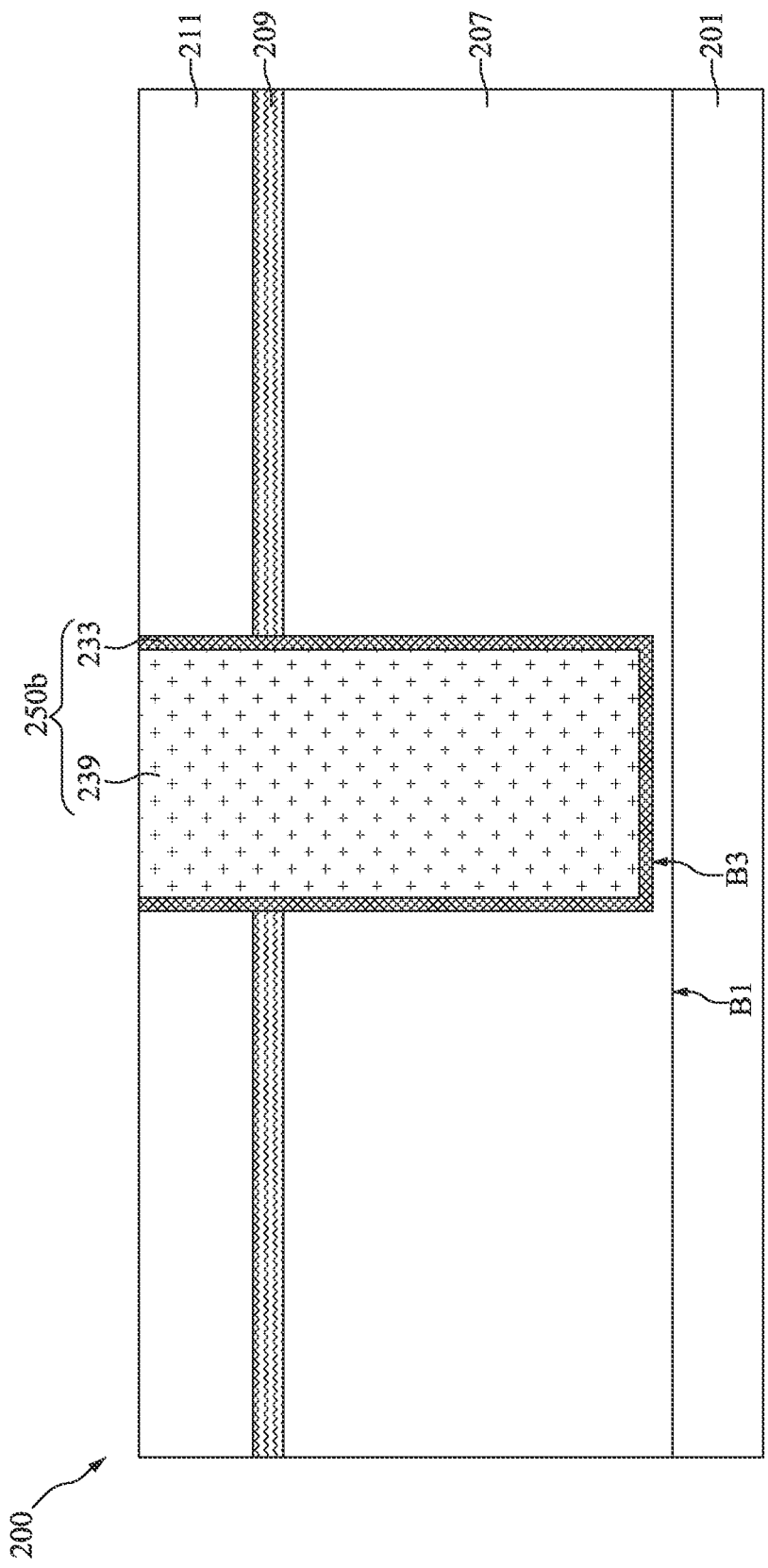
FIG. 5 is a cross-sectional view illustrating a peripheral circuit area of a semiconductor device structure, in accordance with some embodiments.

FIG. 4 is a cross-sectional view illustrating a cell area of a semiconductor device structure 200, such as the cell area A of the memory device 1000 in FIG. 1, and FIG. 5 is a cross-sectional view illustrating a peripheral circuit area of the semiconductor device structure 200, such as the peripheral circuit area B of the memory device 1000 in FIG. 1, in accordance with some embodiments.

As shown in FIG. 4, the cell area of the semiconductor device structure 200 includes a well region 207 disposed in a semiconductor substrate 201, a pad oxide layer 209 disposed over the well region 207, and a pad nitride layer 211 disposed over the pad oxide layer 209, in accordance with some embodiments. In some embodiments, the region of the semiconductor substrate 201 under the well region 207 has a first conductivity type, and the well region 207 has a second conductivity type opposite to the first conductivity type. For example. The region of the semiconductor substrate under the well region 207 is n-type, and the well region 207 is p-type.

The cell area of the semiconductor device structure 200 also includes a STI structure 250a penetrating through the pad nitride layer 211 and the pad oxide layer 209 and extending into the well region 207, in accordance with some embodiments. In some embodiments, the well region 207 is not penetrated through by the STI structure 250a. As shown in FIG. 4, the bottom surface B2 of the STI structure 250a is higher than the bottom surface B1 of the well region 207, in accordance with some embodiments.

In some embodiments, the STI structure 250a in the cell area of the semiconductor device structure 200 includes a first liner 223, a second liner 225 disposed over the first liner 223, a third liner 227 disposed over the second liner 225, and a trench filling layer 229 disposed over the third liner 227. In some embodiments, the trench filling layer 229 is surrounded by the third liner 227, the third liner 227 is surrounded by the second liner 225, and the second liner 225 is separated from the well region 207 by the first liner 223.

In some embodiments, the sidewalls of the pad nitride layer 211 and the sidewalls of the pad oxide layer 209 are covered by and in direct contact with the second liner 225. In some embodiments, the topmost surface T4 of the second liner 225 is higher than the topmost surface T3 of the first liner 223. In some embodiments, the top surfaces of the second liner 225, the third liner 227 and the trench filling layer 229 are substantially coplanar with each other.

In addition, the first liner 223, the second liner 225 and the third liner 227 of the STI structure 250a in the array area of the semiconductor device structure 200 are made of different materials. For example, the first liner 223 is made of silicon oxide, the second liner 225 is made of nitride, and the third liner 227 is made of silicon oxynitride. Furthermore, a first etching selectivity exists between the second liner 225 and the trench filling layer 229, and a second etching selectivity exists between the third liner 227 and the trench filling layer 229.

As shown in FIG. 5, the peripheral circuit area of the semiconductor device structure 200 includes the semiconductor substrate 201, the well region 207 disposed in the semiconductor substrate 201, the pad oxide layer 209, the pad nitride layer 211, and a STI structure 250b penetrating through the pad nitride layer 211 and the pad oxide layer 209 and extending into the well region 207, in accordance with some embodiments. In some embodiments, the well region 207 is not penetrated through by the STI structure 250b in the peripheral circuit area. In some embodiments, the bottom surface B3 of the STI structure 250b is higher than the bottom surface B1 of the well region 207.

In comparison with the STI structure 250a in the cell area of the semiconductor device structure 200, the STI structure 250b in the peripheral circuit area of the semiconductor device structure 200 has a single liner instead of multiple liners. In some embodiments, the STI structure 250b has a liner 233 (also referred to as a fourth liner) and a trench filling layer 239 disposed over the liner 233. In some embodiments, the trench filling layer 239 is surrounded by the liner 233.

Moreover, in some embodiments, the trench filling layer 239 is separated from the pad nitride layer 211, the pad oxide layer 209 and the well region 207 by the liner 233. In some embodiments, the top surfaces of the liner 233 and the trench filling layer 239 are substantially coplanar with each other. In some embodiments, the liner 233 is made of silicon oxide, and is formed by an oxidation process or a deposition process, such as a CVD process or an ALD process.

Figure 6:
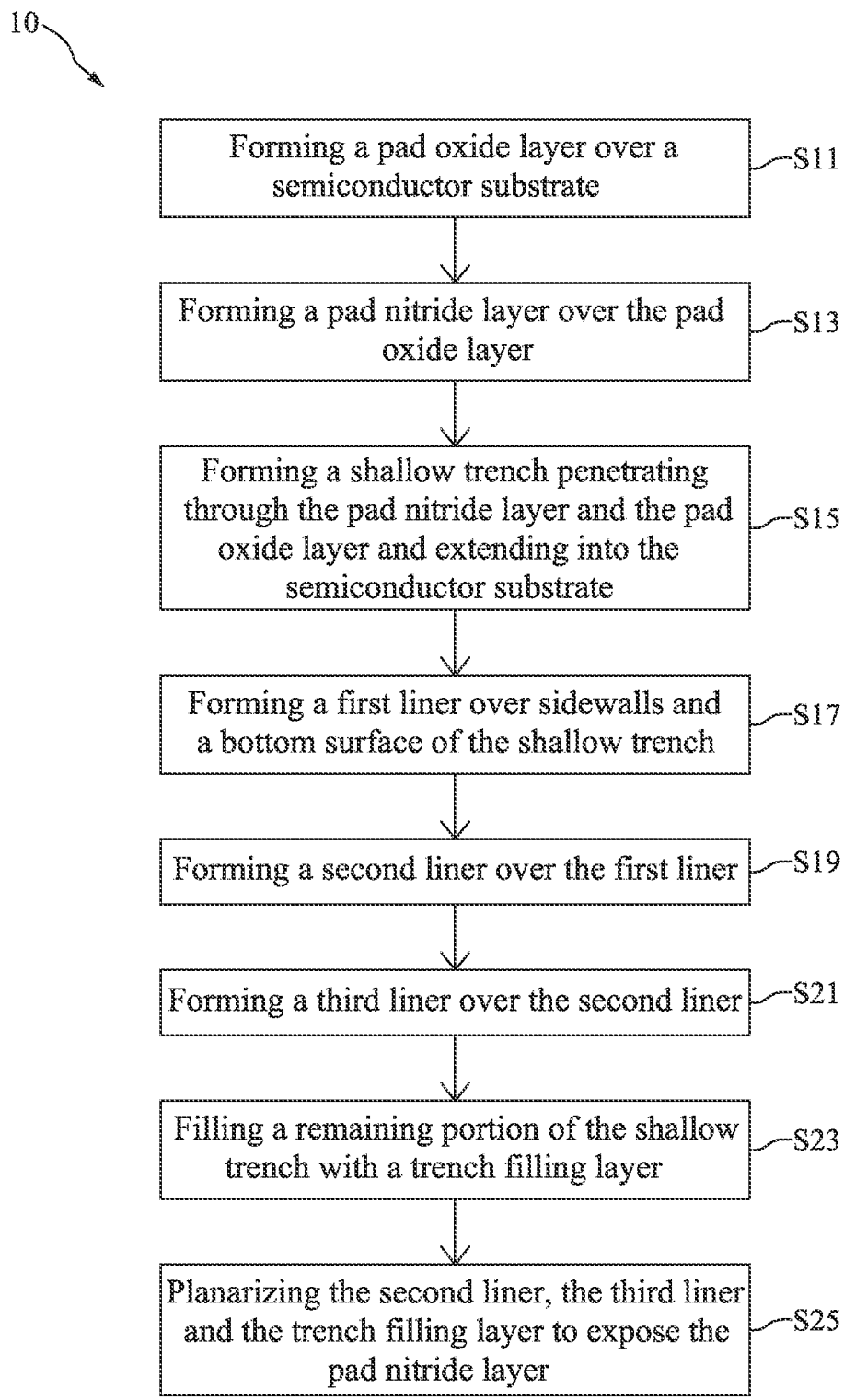
FIG. 6 is a flow diagram illustrating a method for forming a cell area of a semiconductor device structure, in accordance with some embodiments.

FIG. 6 is a flow diagram illustrating a method 10 for forming a cell area of a semiconductor device structure (e.g., the semiconductor device structure 100 or 200), and the method 10 includes steps S11, S13, S15, S17, S19, S21, S23 and S25, in accordance with some embodiments. The steps S11 to S25 of FIG. 6 are elaborated in connection with the following figures.

Figure 7:
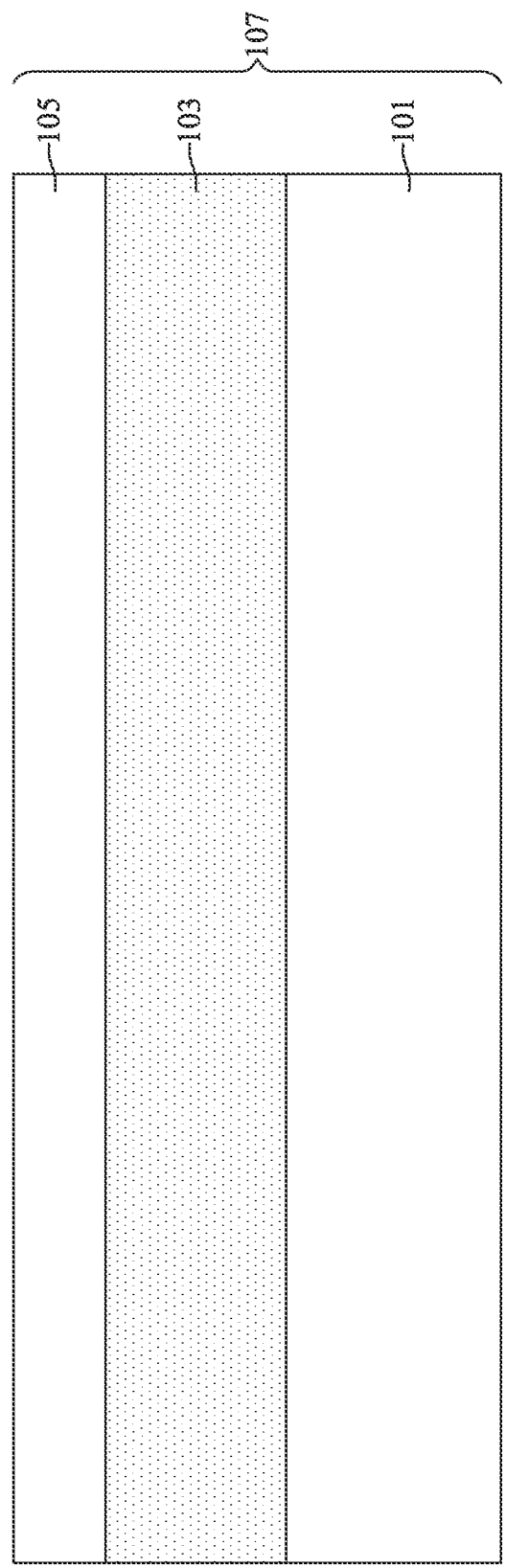
FIG. 7 is a cross-sectional view illustrating an intermediate stage of forming a buried oxide layer and a silicon layer over a semiconductor substrate during the formation of a cell area in a semiconductor device structure, in accordance with some embodiments.

FIGS. 7-13 are cross-sectional views illustrating intermediate stages of forming the cell area in the semiconductor device structure 100, in accordance with some embodiments. As shown in FIG. 7, the semiconductor substrate 101 is provided. The semiconductor substrate 101 may be a semiconductor wafer such as a silicon wafer.

Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the buried oxide layer 103 and the silicon layer 105 are formed over the semiconductor substrate 101 to form a SOI region 107. The SOI region 107 may be formed using separation by implantation of oxygen (SIMOX), where oxygen is implanted below the silicon surface and a subsequent annealing process is performed. However, other alternative processes, such as wafer bonding, oxidation, or deposition may alternatively be used to form the SOI region 107.

Figure 8:
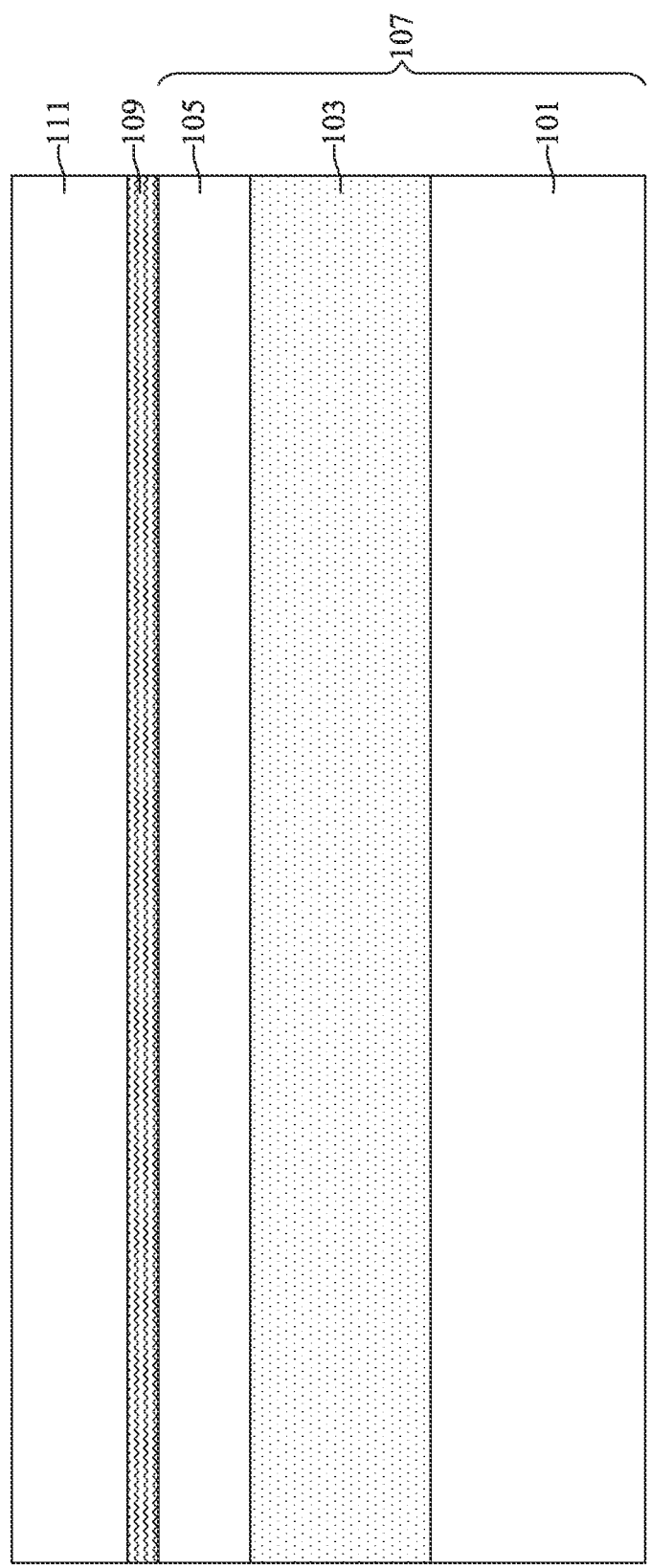
FIG. 8 is a cross-sectional view illustrating an intermediate stage of forming a pad oxide layer and a pad nitride layer during the formation of a cell area in a semiconductor device structure, in accordance with some embodiments.

Next, the pad oxide layer 109 and the pad nitride layer 111 are sequentially formed over the SOI region 107, as shown in FIG. 8 in accordance with some embodiments. The respective steps are illustrated as the steps S11 and S13 in the method 10 shown in FIG. 6. In some embodiments, the pad oxide layer 109 is made of silicon oxide, such as $SiO_2$, and the pad nitride layer 111 is made of silicon nitride, such as $Si_3N_4$. The pad oxide layer 109 and the pad nitride layer 111 may be formed by thermal oxidation, CVD, ALD and/or other applicable method.

Figure 9:
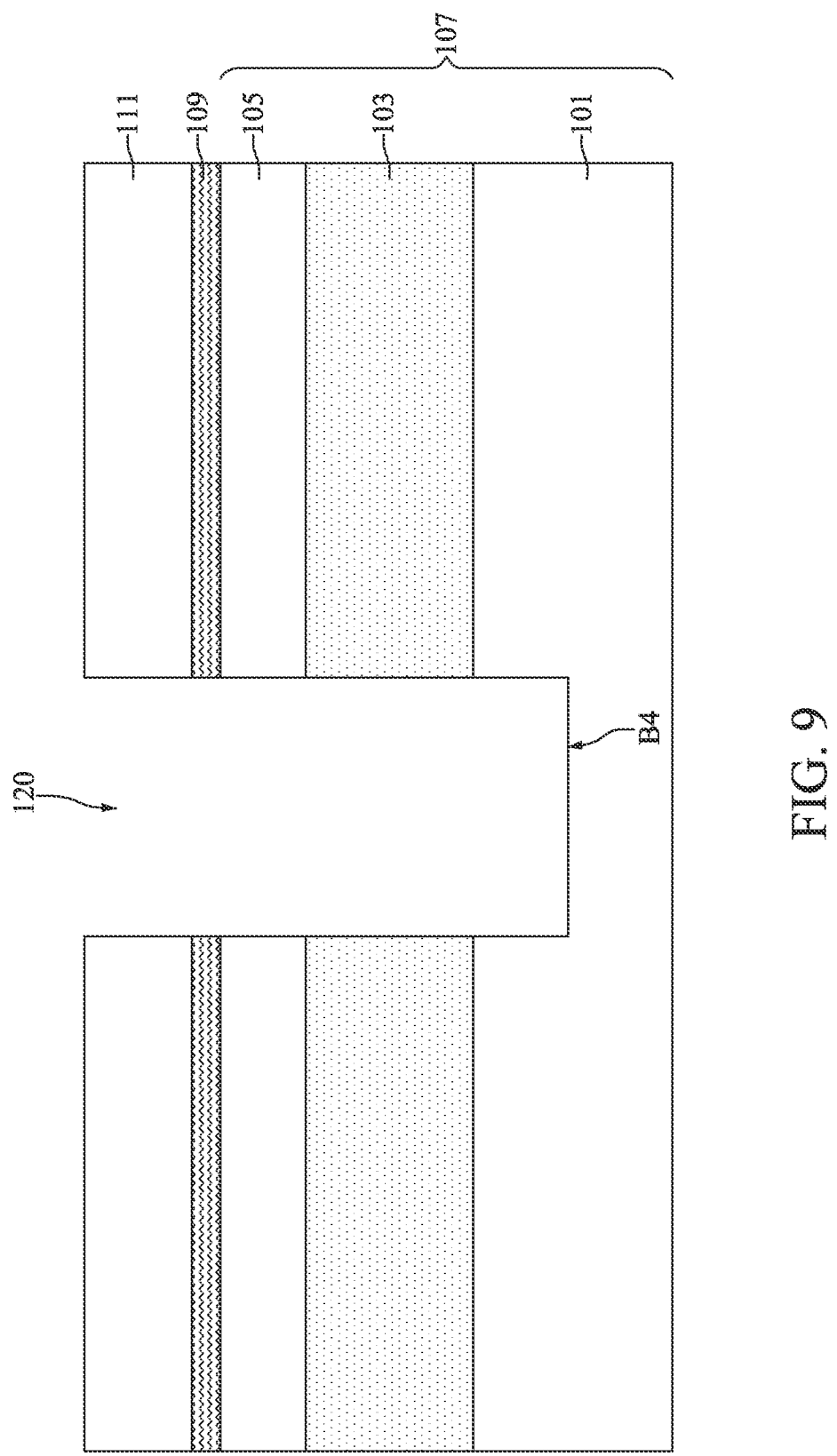
FIG. 9 is a cross-sectional view illustrating an intermediate stage of forming a shallow trench during the formation of a cell area in a semiconductor device structure, in accordance with some embodiments.

After the pad nitride layer 111 is formed, a shallow trench 120 is formed penetrating through the pad nitride layer 111, the pad oxide layer 109, the silicon layer 105, the buried oxide layer 103 and extending into the semiconductor substrate 101, as shown in FIG. 9 in accordance with some embodiments. In some embodiments, the bottom surface B4 of the shallow trench 120 is located in the semiconductor substrate 101. The respective step is illustrated as the step S15 in the method 10 shown in FIG. 6.

In some embodiments, the formation of the shallow trench 120 includes forming a patterned mask (not shown) over the pad nitride layer 111, and etching the underlying structure by using the patterned mask as a mask. The etching may be performed using a wet etching process, a dry etching process, or a combination thereof. After the shallow trench 120 is formed, the patterned mask may be removed using, for example, an ashing process followed by a wet clean process.

Figure 10:
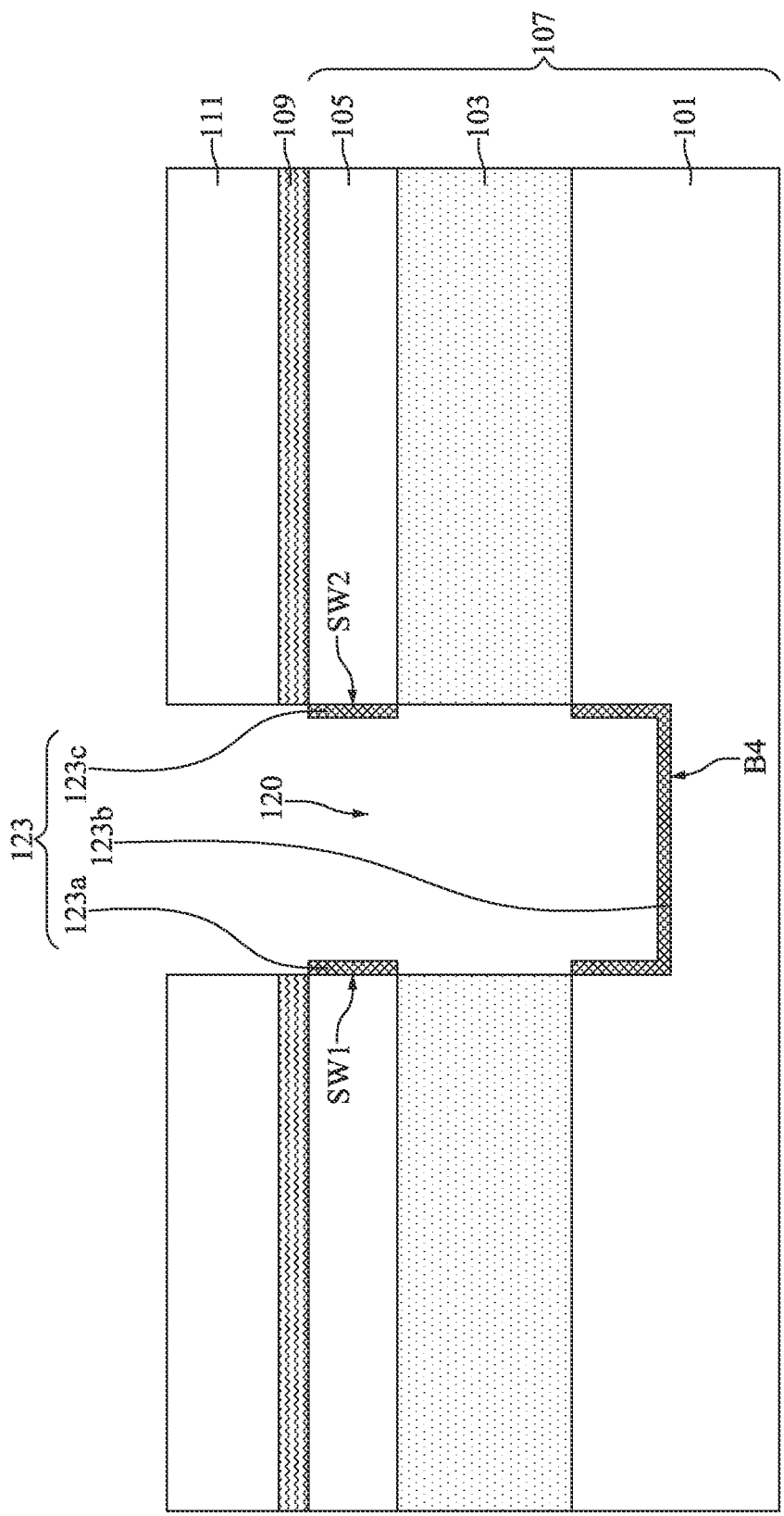
FIG. 10 is a cross-sectional view illustrating an intermediate stage of forming a first liner during the formation of a cell area in a semiconductor device structure, in accordance with some embodiments.

Next, the first liner 123 is formed over the sidewalls and the bottom surface B4 of the shallow trench 120, as shown in FIG. 10 in accordance with some embodiments. The respective step is illustrated as the step S17 in the method 10 shown in FIG. 6. More specifically, the opposite sidewalls SW1 and SW2 of the silicon layer 105 (i.e., the sidewalls of the silicon layer 105 exposed in the shallow trench 120) are covered by and in direct contact with the portions 123a and 123c of the first liner 123, and the exposed sidewalls and the exposed surface of the semiconductor substrate 101 in the shallow trench 120 (i.e., the bottom surface B4 of the shallow trench 120) are covered by and in direct contact with the portion 123b of the first liner 123.

In some embodiments, the first liner 123 is made of silicon oxide, such as $SiO_2$, and is formed by an oxidation process. In some embodiments, the oxidation process for forming the first liner 123 is a selective oxidation due to different compositions of the layers in the SOI region 107. In some embodiments, the exposed sidewalls and/or surfaces of the silicon layer 105 and the semiconductor substrate 101 of the SOI region 107 are completely covered by the first liner 123, while the sidewalls of the pad nitride layer 111, the pad oxide layer 109 and the buried oxide layer 103 in the shallow trench 120 are at least partially exposed.

Figure 11:
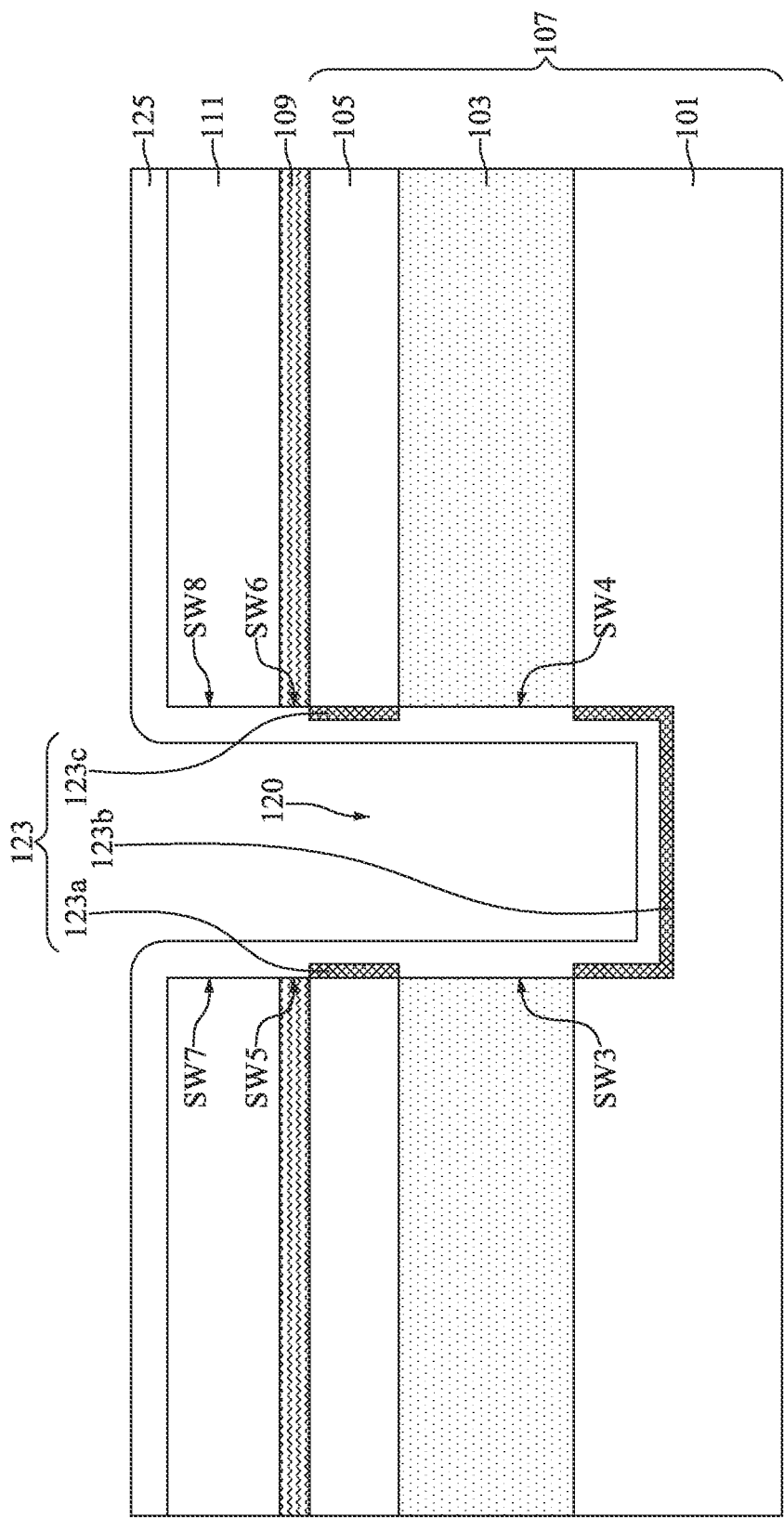
FIG. 11 is a cross-sectional view illustrating an intermediate stage of forming a second liner during the formation of a cell area in a semiconductor device structure, in accordance with some embodiments.

Subsequently, the second liner 125 is formed over the first liner 123, as shown in FIG. 11 in accordance with some embodiments. The respective step is illustrated as the step S19 in the method 10 shown in FIG. 6. In some embodiments, the second liner 125 is conformally formed over the top surface of the pad nitride layer 111 and lining the remaining portion of the shallow trench 120.

In some embodiments, the first liner 123 is completely covered by the second liner 125, and the exposed sidewalls SW7 and SW8 of the pad nitride layer 111, the exposed sidewalls SW5 and SW6 of the pad oxide layer 109 and the exposed sidewalls SW3 and SW4 of the buried oxide layer 103 are covered by and in direct contact with the second liner 125. In some embodiments, the second liner 125 is made of nitride, such as silicon nitride, and is formed by nitridation process, such as a rapid thermal nitridation (RTN) process.

Figure 12:
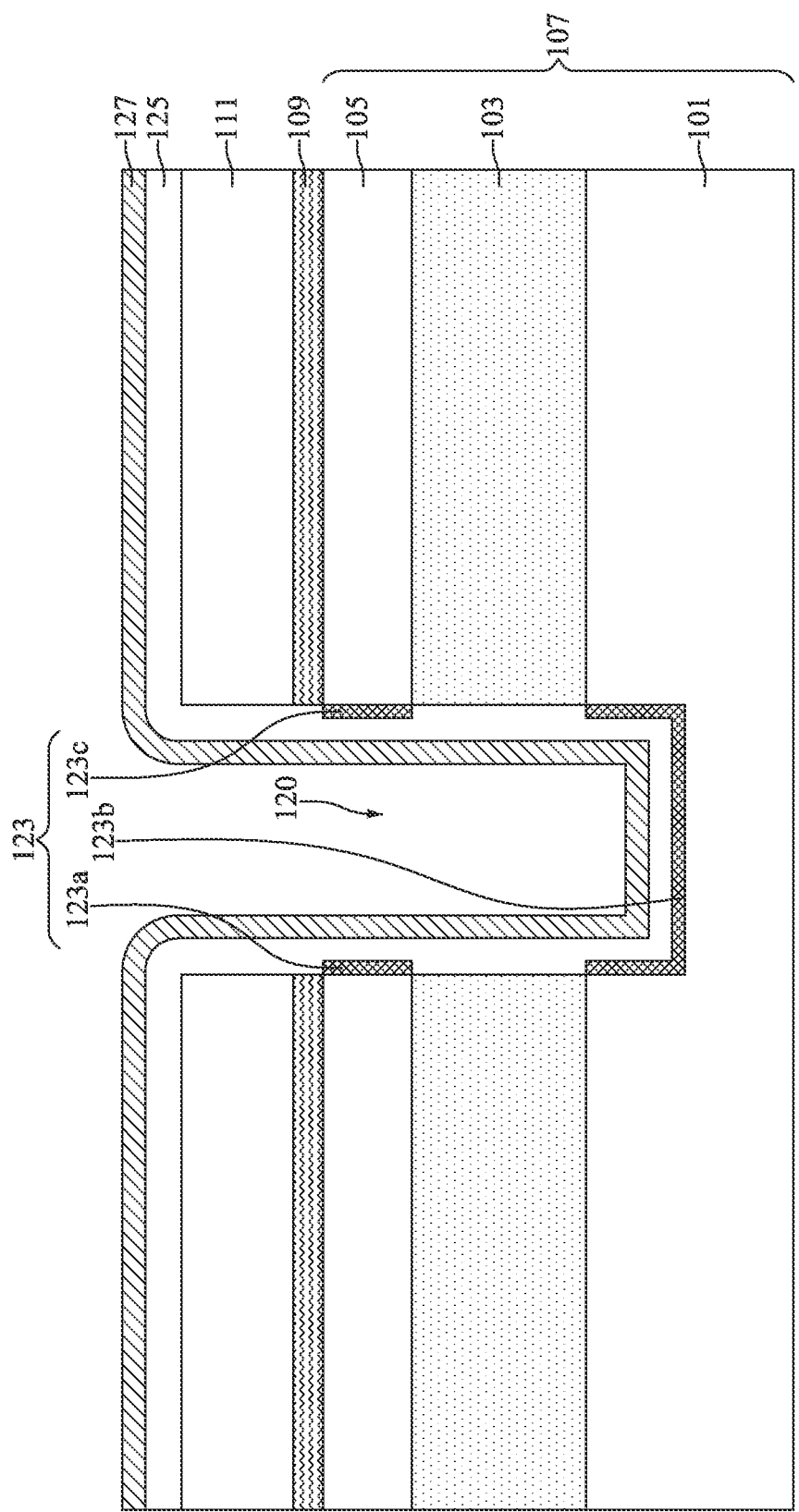
FIG. 12 is a cross-sectional view illustrating an intermediate stage of forming a third liner during the formation of a cell area in a semiconductor device structure, in accordance with some embodiments.

Then, the third liner 127 is formed over the second liner 125, as shown in FIG. 12 in accordance with some embodiments. The respective step is illustrated as the step S21 in the method 10 shown in FIG. 6. In some embodiments, the third liner 127 is conformally formed over the top surface of the pad nitride layer 111 and lining the remaining portion of the shallow trench 120. In some embodiments, the third liner 127 is made of silicon oxynitride, and is formed by an in-situ steam generation (ISSG) process.

Figure 13:
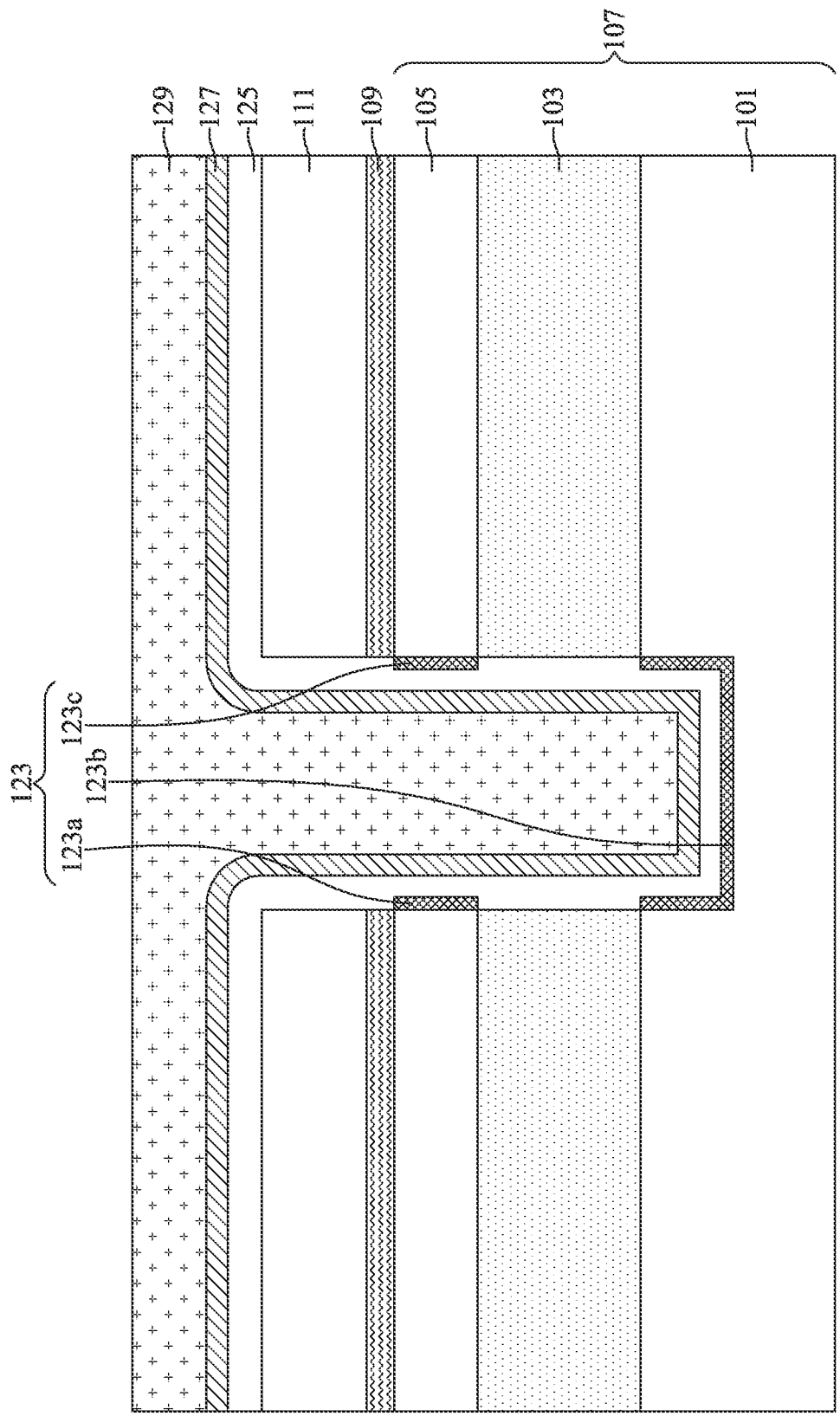
FIG. 13 is a cross-sectional view illustrating an intermediate stage of forming a trench filling layer during the formation of a cell area in a semiconductor device structure, in accordance with some embodiments.

Next, the trench filling layer 129 is formed over the third liner 127 and filling the remaining portion of the shallow trench 120, as shown in FIG. 13 in accordance with some embodiments. The respective step is illustrated as the step S23 in the method 10 shown in FIG. 6.

In some embodiments, the trench filling layer 129 is made of a dielectric material, such as silicon oxide, silicon nitride, silicon oxynitride, silicon carbonitride, silicon oxide carbonitride, or a combination thereof. It should be noted that the material of the trench filling layer 129 is different from the materials of the second liner 125 and the third liner 127, such that sufficient etching selectivities exist between the second liner 125 and the trench filling layer 129 and between the third liner 127 and the trench filling layer 129. Moreover, the trench filling layer 129 may be formed by a deposition process, such as a CVD process or an ALD process.

Subsequently, referring back to FIG. 2, a planarization process is performed on the trench filling layer 129, the third liner 127, and the second liner 125 to expose the top surface of the pad nitride layer 111, such that the top surfaces of the trench filling layer 129, the third liner 127, and the second liner 125 are substantially coplanar with each other, in accordance with some embodiments. The respective step is illustrated as the step S25 in the method 10 shown in FIG. 6. In some embodiments, the planarization process is a chemical mechanical polishing (CMP) process. After the planarization process, the STI structure 150a in the array area of the semiconductor device structure 100 is obtained.

Since there are multiple liners surrounding the trench filling layer 129 in the STI structure 150a, and etching selectivities exist between the liners and the trench filling layer 129, the sidewalls of the SOI region 107 may be protected from being exposed during subsequent etching process (for example, for recessing the trench filling layer 129). As a result, electrical short between the semiconductor substrate 101 and the silicon layer 105 may be prevented.

Figure 14:
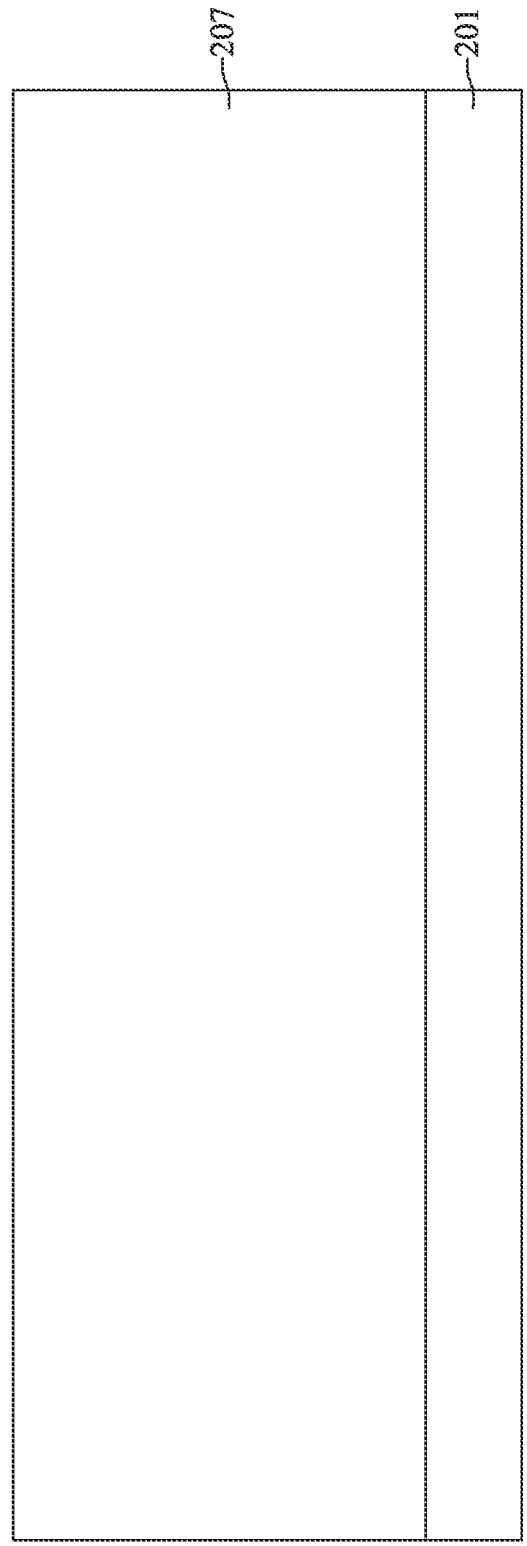
FIG. 14 is a cross-sectional view illustrating an intermediate stage of forming a well region in a semiconductor substrate during the formation of a cell area in a semiconductor device structure, in accordance with some embodiments.

FIGS. 14-20 are cross-sectional views illustrating intermediate stages of forming the cell area in the semiconductor device structure 200, in accordance with some embodiments. As shown in FIG. 14, the semiconductor substrate 201 is provided. The semiconductor substrate 201 may be similar to the semiconductor substrate 101 described above and the description is not repeated herein.

In some embodiments, the well region 207 is formed in the semiconductor substrate 201. The well region 207 may be formed by an ion implantation process, and P-type dopants, such as boron (B), gallium (Ga), or indium (In), or N-type dopants, such as phosphorous (P) or arsenic (As), can be implanted to form the well region 207, depending on the conductivity type of the region of the semiconductor substrate 201 under the well region. As mentioned above, the conductivity type of the well region 207 is opposite to the conductivity type of the region of the semiconductor substrate 201 under the well region 207. For example, in some embodiments, the well region 207 is p-type, and the region of the semiconductor substrate 201 under the well region 207 is n-type.

Figure 15:
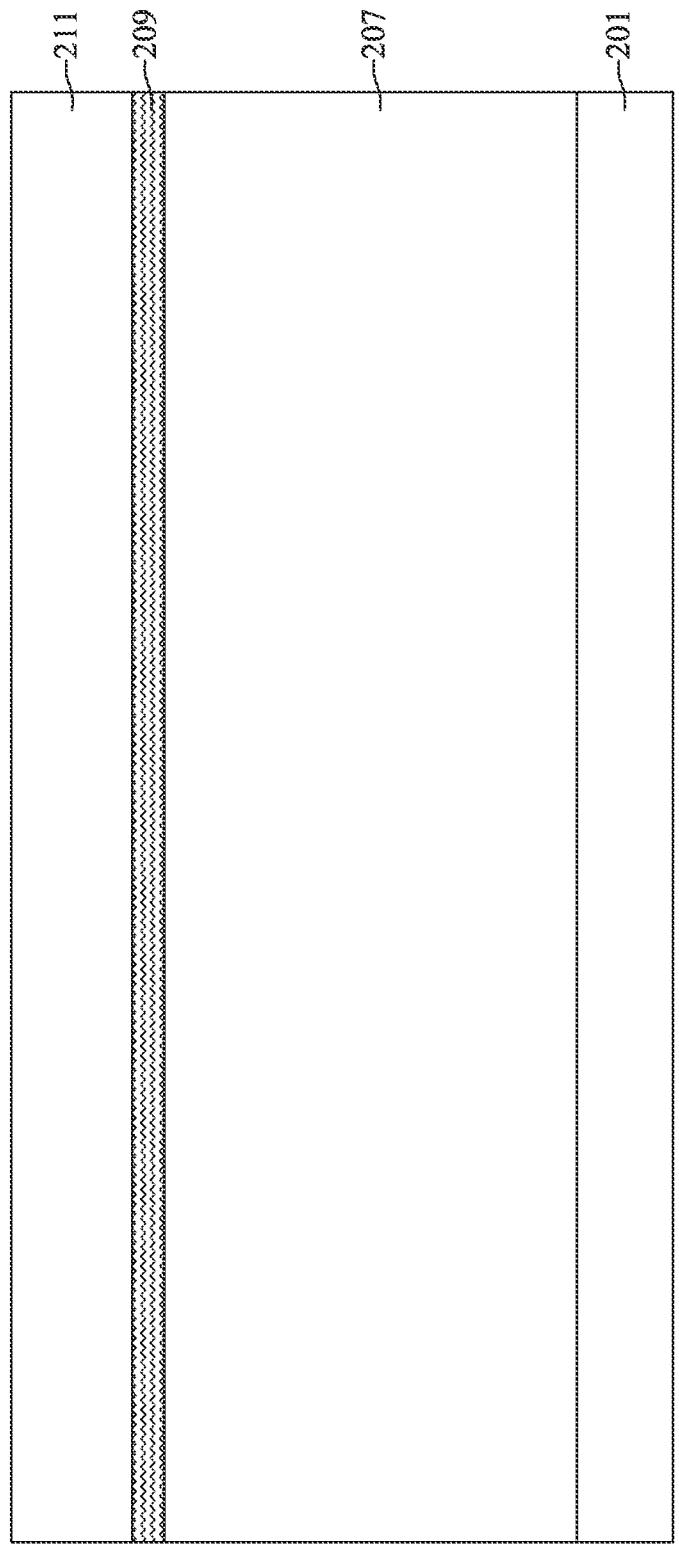
FIG. 15 is a cross-sectional view illustrating an intermediate stage of forming a pad oxide layer and a pad nitride layer during the formation of a cell area in a semiconductor device structure, in accordance with some embodiments.

Next, the pad oxide layer 209 and the pad nitride layer 211 are sequentially formed over the semiconductor substrate 201 and covering the well region 207, as shown in FIG. 15 in accordance with some embodiments. The respective steps are illustrated as the step S11 and S13 in the method 10 shown in FIG. 6. Some materials and processes used to form the pad oxide layer 209 and the pad nitride layer 211 are similar to, or the same as those used to form the pad oxide layer 109 and the pad nitride layer 111, respectively, and details thereof are not repeated herein.

Figure 16:
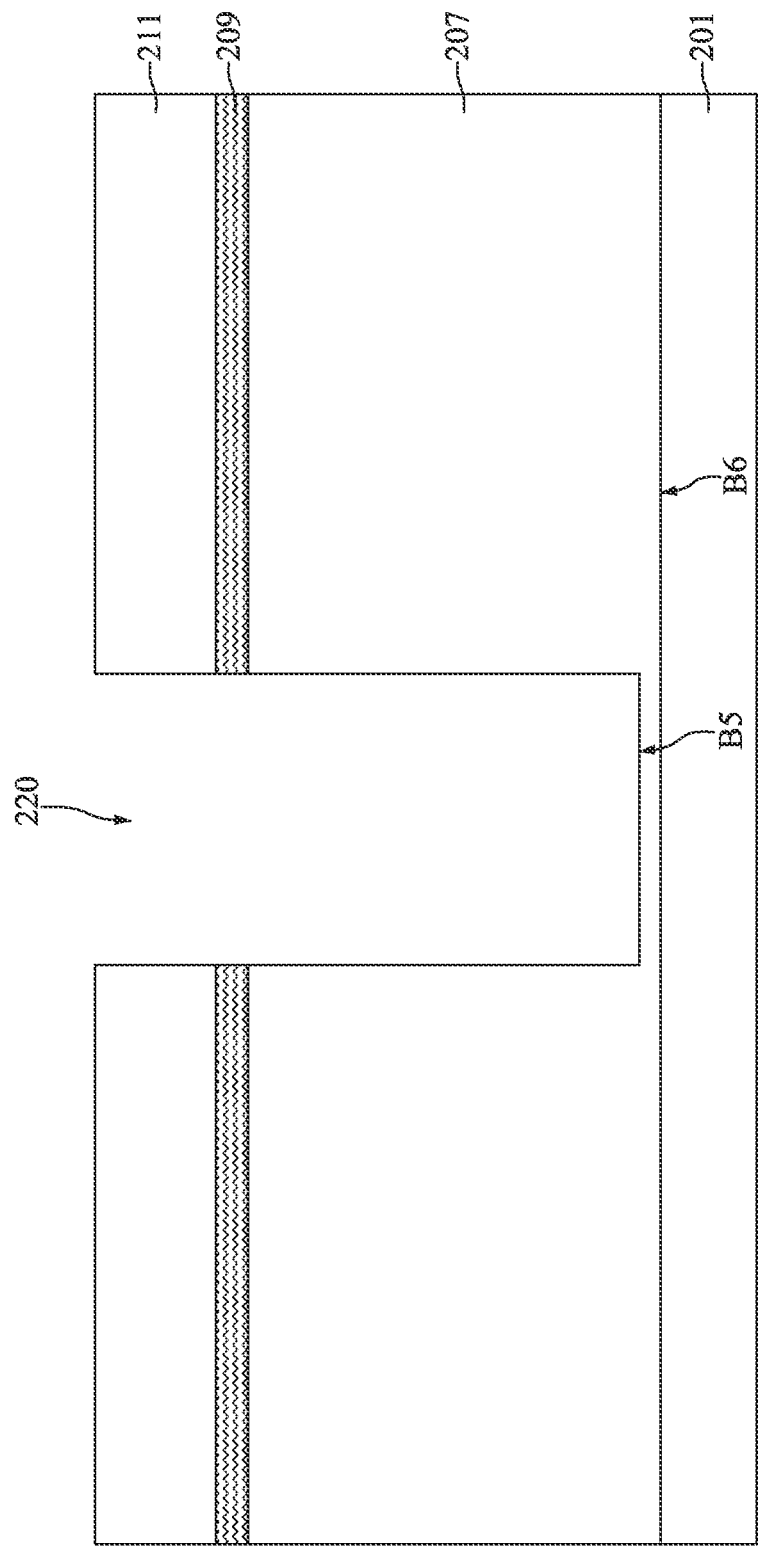
FIG. 16 is a cross-sectional view illustrating an intermediate stage of forming a shallow trench during the formation of a cell area in a semiconductor device structure, in accordance with some embodiments.

After the pad nitride layer 211 is formed, a shallow trench 220 is formed penetrating through the pad nitride layer 211 and the pad oxide layer 209 and extending into the well region 207, as shown in FIG. 16 in accordance with some embodiments. In some embodiments, the bottom surface B5 of the shallow trench 220 is located in the well region 207 and higher than the bottom surface B6 of the well region 207. The respective step is illustrated as the step S15 in the method 10 shown in FIG. 6. Some processes used to form the shallow trench 220 are similar to, or the same as those used to form the shallow trench 120, and details thereof are not repeated herein.

Figure 17:
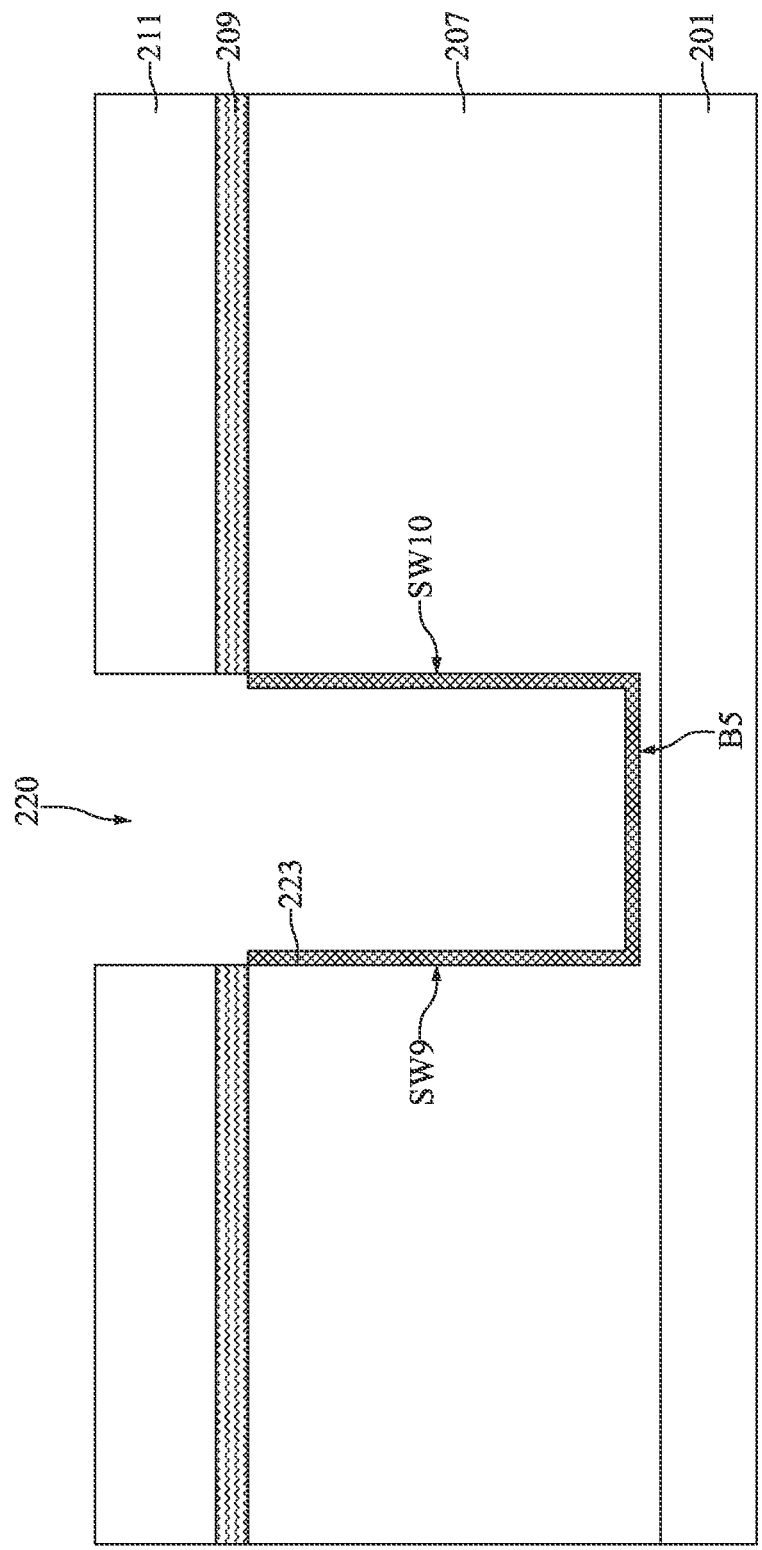
FIG. 17 is a cross-sectional view illustrating an intermediate stage of forming a first liner during the formation of a cell area in a semiconductor device structure, in accordance with some embodiments.

Next, the first liner 223 is formed over the sidewalls and the bottom surface B5 of the shallow trench 220, as shown in FIG. 17 in accordance with some embodiments. The respective step is illustrated as the step S17 in the method 10 shown in FIG. 6. More specifically, the exposed sidewalls SW9 and SW10 and the exposed surface of the well region 207 (i.e., the bottom surface B5 of the shallow trench 220) are covered by and in direct contact with the first liner 223.

Some materials and processes used to form the first liner 223 are similar to, or the same as those used to form the first liner 123 of the semiconductor device structure 100, and details thereof are not repeated herein. It should be noted that the oxidation process for forming the first liner 223 is a selective oxidation due to different compositions of the well region 207, the pad oxide layer 209 and the pad nitride layer 211. In some embodiments, the exposed sidewalls and/or surfaces of the well region 207 are completely covered by the first liner 223, while the sidewalls of the pad nitride layer 211 and the pad oxide layer 209 in the shallow trench 220 are at least partially exposed.

Figure 18:
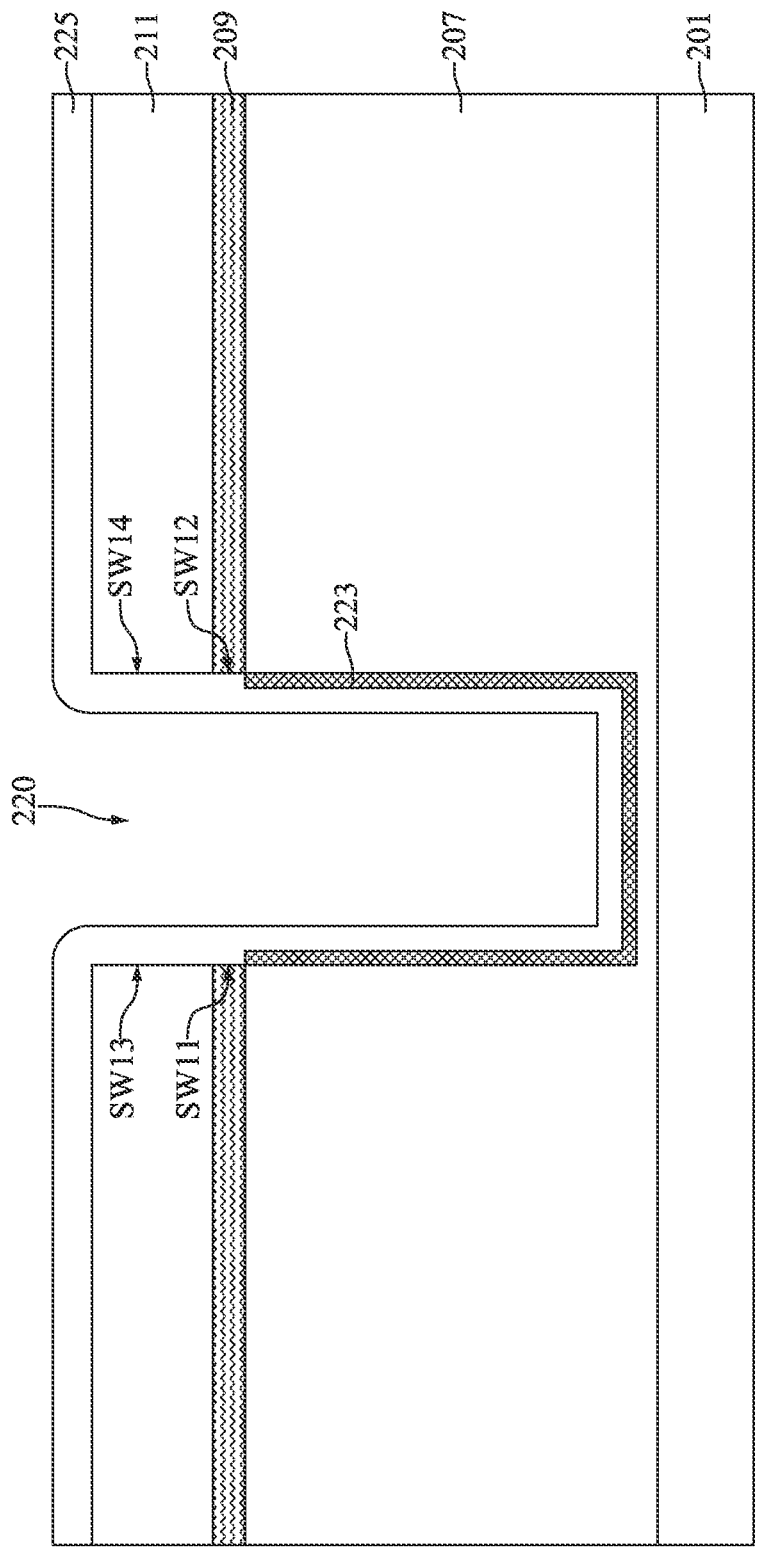
FIG. 18 is a cross-sectional view illustrating an intermediate stage of forming a second liner during the formation of a cell area in a semiconductor device structure, in accordance with some embodiments.

Subsequently, the second liner 225 is formed over the first liner 223, as shown in FIG. 18 in accordance with some embodiments. The respective step is illustrated as the step S19 in the method 10 shown in FIG. 6. Similar to the second liner 125 of the semiconductor device structure 100, the second liner 225 is conformally formed over the top surface of the pad nitride layer 211 and lining the remaining portion of the shallow trench 220.

In some embodiments, the first liner 223 is completely covered by the second liner 225, and the exposed sidewalls SW13 and SW14 of the pad nitride layer 211, the exposed sidewalls SW11 and SW12 of the pad oxide layer 209 are covered by and in direct contact with the second liner 225. Some materials and processes used to form the second liner 225 are similar to, or the same as those used to form the second liner 125 of the semiconductor device structure 100, and details thereof are not repeated herein.

Figure 19:
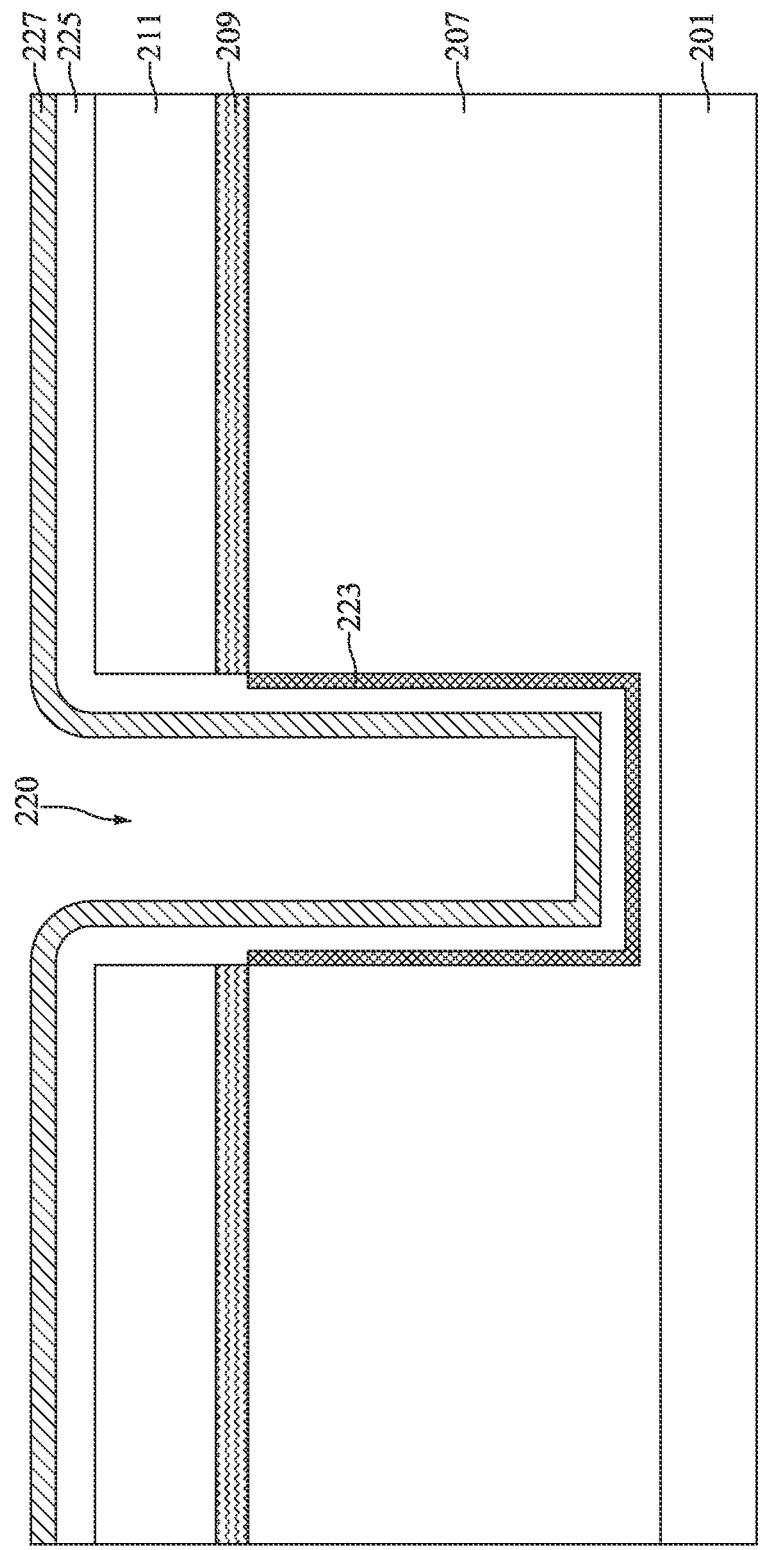
FIG. 19 is a cross-sectional view illustrating an intermediate stage of forming a third liner during the formation of a cell area in a semiconductor device structure, in accordance with some embodiments.

Then, the third liner 227 is formed over the second liner 225, as shown in FIG. 19 in accordance with some embodiments. The respective step is illustrated as the step S21 in the method 10 shown in FIG. 6. In some embodiments, the third liner 227 is conformally formed over the top surface of the pad nitride layer 211 and lining the remaining portion of the shallow trench 220. Some materials and processes used to form the third liner 227 are similar to, or the same as those used to form the third liner 127 of the semiconductor device structure 100, and details thereof are not repeated herein.

Figure 20:
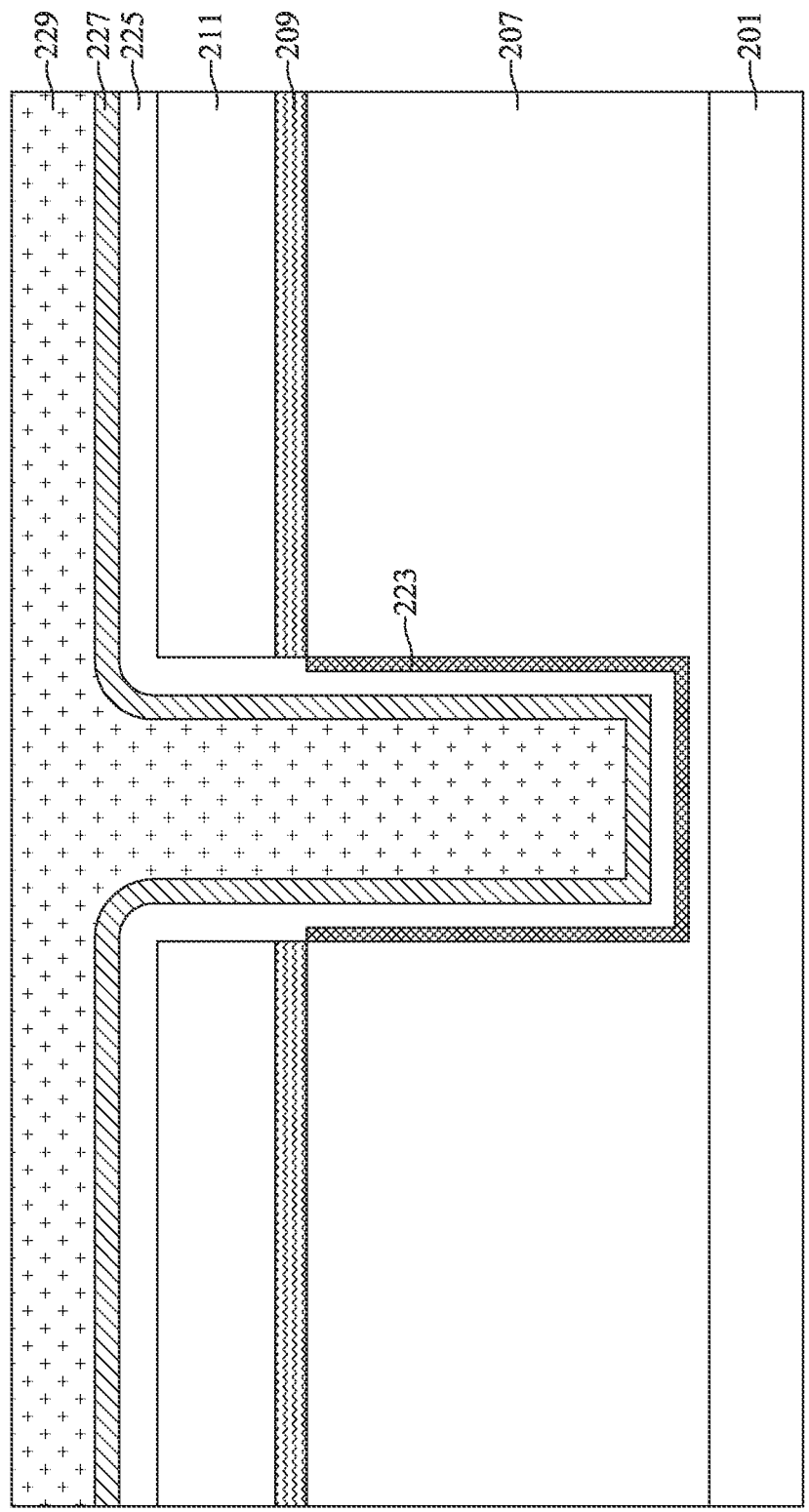
FIG. 20 is a cross-sectional view illustrating an intermediate stage of forming a trench filling layer during the formation of a cell area in a semiconductor device structure, in accordance with some embodiments.

Next, the trench filling layer 229 is formed over the third liner 227 and filling the remaining portion of the shallow trench 220, as shown in FIG. 20 in accordance with some embodiments. The respective step is illustrated as the step S23 in the method 10 shown in FIG. 6. Some materials and processes used to form the trench filling layer 229 are similar to, or the same as those used to form the trench filling layer 129 of the semiconductor device structure 100, and details thereof are not repeated herein. It should be noted that the material of the trench filling layer 229 is different from the materials of the second liner 225 and the third liner 227, such that sufficient etching selectivities exist between the second liner 225 and the trench filling layer 229 and between the third liner 227 and the trench filling layer 229.

Subsequently, referring back to FIG. 4, a planarization process is performed on the trench filling layer 229, the third liner 227, and the second liner 225 to expose the top surface of the pad nitride layer 211, such that the top surfaces of the trench filling layer 229, the third liner 227, and the second liner 225 are substantially coplanar with each other, in accordance with some embodiments. The respective step is illustrated as the step S25 in the method 10 shown in FIG. 6. In some embodiments, the planarization process is a CMP process. After the planarization process, the STI structure 250a in the array area of the semiconductor device structure 200 is obtained.

Since there are multiple liners surrounding the trench filling layer 229 in the STI structure 250a, and etching selectivities exist between the liners and the trench filling layer 229, the sidewalls of the well region 207 may be protected from being exposed during subsequent etching process (for example, for recessing the trench filling layer 229). As a result, electrical short may be prevented.

Embodiments of the semiconductor device structures 100 and 200 and method for forming the same are provided in the disclosure. In some embodiments, the semiconductor device structure 100 includes the STI structure 150a disposed in the SOI region 107. The STI structure 150a includes the first liner 123 contacting the semiconductor substrate 101 and the silicon layer 105 in the SOI region 107, the second liner 125 covering the first liner 123, the third liner 127 covering the second liner 125, and the trench filling layer 129 disposed over the third liner 127 and separated from the second liner 125 by the third liner 127. Since there are multiple liners disposed between the trench filling layer 129 and the SOI region 107, and etching selectivities exist between the liners and the trench filling layer 129, the sidewalls of the SOI region 107 may be protected from being exposed during subsequent etching process (for example, for recessing the trench filling layer 129). This may prevent electrical short between the semiconductor substrate 101 and the silicon layer 105.

In some embodiments, the semiconductor device structure 200 includes the STI structure 250a disposed in the well region 207 of the semiconductor substrate 201. The STI structure 250a includes the first liner 223 contacting the well region 207, the second liner 225 covering the first liner 223, the third liner 227 covering the second liner 225, and the trench filling layer 229 disposed over the third liner 227 and separated from the second liner 225 by the third liner 227. Since there are multiple liners disposed between the trench filling layer 229 and the well region 207, and etching selectivities exist between the liners and the trench filling layer 229, the well region 207 may be protected from being exposed during subsequent etching process (for example, for recessing the trench filling layer 229). This may prevent electrical short of the semiconductor device structure 200 in subsequent processing steps (for example, for forming a conductive component over the well region 207).

In one embodiment of the present disclosure, a semiconductor device structure is provided. The semiconductor device structure includes a silicon-on-insulator (SOI) region. The SOI region includes a semiconductor substrate, a buried oxide layer disposed over the semiconductor substrate, and a silicon layer disposed over the buried oxide layer. The semiconductor device structure also includes a first shallow trench isolation (STI) structure penetrating through the silicon layer and the buried oxide layer and extending into the semiconductor substrate. The first STI structure includes a first liner contacting the semiconductor substrate and the silicon layer, a second liner covering the first liner and contacting the buried oxide layer, and a third liner covering the second liner. The first liner, the second liner and the third liner are made of different materials. The first STI structure also includes a first trench filling layer disposed over the third liner and separated from the second liner by the third liner.

In another embodiment of the present disclosure, a method for forming a semiconductor device structure is provided. The method includes forming a pad oxide layer over a semiconductor substrate, and forming a pad nitride layer over the pad oxide layer. The method also includes forming a shallow trench penetrating through the pad nitride layer and the pad oxide layer and extending into the semiconductor substrate, and forming a first liner over sidewalls and a bottom surface of the shallow trench. The method further includes forming a second liner over the first liner, and forming a third liner over the second liner. In addition, the method includes filling a remaining portion of the shallow trench with a trench filling layer over the third liner, and planarizing the second liner, the third liner and the trench filling layer to expose the pad nitride layer. The first liner and the remaining portions of the second liner, the third liner and the trench filling layer collectively form a shallow trench isolation (STI) structure in an array area.

The embodiments of the present disclosure have some advantageous features. By forming multiple liners in the STI structure and between the trench filling layer and the semiconductor substrate, the sidewalls of the semiconductor substrate interfacing with the STI structure may be protected from being exposed during subsequent etching process, which prevents electrical short. As a result, the device performance may be enhanced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device structure, comprising:
    a silicon-on-insulator (SOI) region comprising a semiconductor substrate, a buried oxide layer disposed over the semiconductor substrate, and a silicon layer disposed over the buried oxide layer;
    a first shallow trench isolation (STI) structure penetrating through the silicon layer and the buried oxide layer and extending into the semiconductor substrate, wherein the first STI structure comprises:
        a first liner contacting the semiconductor substrate and the silicon layer;
        a second liner covering the first liner and contacting the buried oxide layer;
        a third liner covering the second liner, wherein the first liner, the second liner and the third liner are made of different materials; and
        a first trench filling layer disposed over the third liner and separated from the second liner by the third liner.

2. The semiconductor device structure of claim 1, wherein the first liner completely separates the second liner from the semiconductor substrate and the silicon layer.

3. The semiconductor device structure of claim 1, wherein the first liner includes a first portion and a second portion covering opposite sidewalls of the silicon layer, and a third portion disposed between the second liner and the semiconductor substrate, and wherein the first portion, the second portion and the third portion of the first liner are disconnected with each other.

4. The semiconductor device structure of claim 1, wherein the first liner is made of silicon oxide, the second liner is made of nitride, and the third liner is made of silicon oxynitride, and
    wherein a first etching selectivity exists between the second liner and the first trench filling layer, and a second etching selectivity exists between the third liner and the first trench filling layer.

5. The semiconductor device structure of claim 1, further comprising:
    a pad oxide layer disposed over the silicon layer of the SOI region; and
    a pad nitride layer disposed over the pad oxide layer, wherein the first STI structure penetrates through the pad oxide layer and the pad nitride layer, and wherein sidewalls of the pad oxide layer and sidewalls of the pad nitride layer are covered by and in direct contact with the second liner of the first STI structure.

6. The semiconductor device structure of claim 5, further comprising:
a second shallow trench isolation (STI) structure penetrating through the pad oxide layer and the pad nitride layer and extending into the semiconductor substrate, wherein the second STI structure comprises:
a second trench filling layer; and
a fourth liner separating the second trench filling layer from the pad oxide layer, the pad nitride layer and the semiconductor substrate.

7. The semiconductor device structure of claim 6, wherein the first STI structure is disposed in an array area, and the second STI structure is disposed in a peripheral circuit area.

* * * * *